(12) United States Patent
Choi

(10) Patent No.: US 8,853,948 B2
(45) Date of Patent: Oct. 7, 2014

(54) MULTI DISCHARGING TUBE PLASMA REACTOR

(71) Applicant: Dai-Kyu Choi, Yongin-si (KR)

(72) Inventor: Dai-Kyu Choi, Yongin-si (KR)

( * ) Notice: Subject to any disclaimer, the term of this patent is extended or adjusted under 35 U.S.C. 154(b) by 94 days.

(21) Appl. No.: 13/730,277

(22) Filed: Dec. 28, 2012

(65) Prior Publication Data

US 2013/0278135 A1  Oct. 24, 2013

(30) Foreign Application Priority Data

Apr. 18, 2012 (KR) .................. 10-2012-0040197
Apr. 18, 2012 (KR) .................. 10-2012-0040198
Dec. 18, 2012 (KR) .................. 10-2012-0148032

(51) Int. Cl.
*H01J 7/24* (2006.01)
*H05B 31/26* (2006.01)

(52) U.S. Cl.
USPC .................. 315/111.51; 315/34; 315/111.21; 315/111.41

(58) Field of Classification Search
USPC ........ 315/34, 111.01, 111.21, 111.41, 111.51
See application file for complete search history.

(56) References Cited

U.S. PATENT DOCUMENTS

2005/0000655 A1* 1/2005 Wi ........................... 156/345.48
2007/0012563 A1* 1/2007 Wi ........................... 204/298.25

* cited by examiner

*Primary Examiner* — Anh Tran
(74) *Attorney, Agent, or Firm* — Birch, Stewart, Kolasch & Birch, LLP

(57) ABSTRACT

A plasma reactor having multi discharging tubes is disclosed, through which activated gas containing ion, free radical, atom and molecule is generated through plasma discharging, and different process gases are injected into multi discharging tubes in which solid, power and gas, etc., are plasma-treated with the activated gas to perform processes including cleaning process for semiconductor, and a plasma state can be maintained even at low power.

17 Claims, 25 Drawing Sheets

MULTI DISCHARGING TUBE PLASMA REACTOR

PRIORITY

This application claims the benefit under 35 U.S.C. §119 (a) the benefit of Korean Patent Application No. 10-2012-0040198 filed on Apr. 18, 2012, Korean Patent Application No. 10-2012-0040197 filed on Apr. 18, 2012 and Korean Patent Application No. 10-2012-0148032 filed on Dec. 18, 2012, the entire contents of which are incorporated herein by reference

BACKGROUND (a) Technical Field

The present invention relates to a plasma reactor having multi discharging tubes, and more particularly, to a plasma reactor having multi discharging tubes through which activated gas containing ion, free radical, atom and molecule is generated through plasma discharging, and different process gases are injected into multi discharging tubes in which solid, power and gas, etc., are plasma-treated with the activated gas to perform processes including cleaning process for semiconductor, and a plasma state can be maintained even at low power.

(b) Background Art

Generally, a plasma discharging has been used for exciting gas to generate activated gas containing ion, free radical, atom and molecule. The activated gas is used widely in various fields, representatively in semiconductor manufacturing process, for example etching, deposition, cleaning and ashing, etc.

Recently, wafer or LCD glass substrate for manufacturing semiconductor device has become much larger, and thus it is requested a plasma source which has a higher control ability of plasma ion energy, a treatment ability of a large area and easy expandability.

Further, it has been known that remote plasma is used efficiently for manufacturing semiconductor by using plasma. For example, the remote plasma is used for cleaning a process chamber or ashing to strip photo-resist.

The remote plasma reactor (or called as a remote plasma generator) may use a Transformer Coupled Plasma Source (TCPS) or an Inductively Coupled Plasma Source (ICPS).

The remote plasma reactor using the transformer coupled plasma source has a reactor body of a toroidal structure to which a magnetic core provided with a first wound coil is equipped. The remote plasma reactor using the inductively coupled plasma source has a reactor body of a hollow tube structure to which an inductively coupled antenna is equipped.

However, in case of the remote plasma reactor using the transformer coupled plasma source, it is operated at a comparatively high voltage environment due to its characteristics and thus it is extremely difficult to ignite plasma or maintain the ignited plasma at a low voltage environment.

Further, in case of the remote plasma reactor using the inductively coupled plasma source, it can be operated at a comparatively low voltage environment due to its characteristics whereas a supply power has to be increased for operating the remote plasma reactor and in this case the inside of the reactor body may be damaged due to ion impact.

In addition, a remote plasma reactor that is operated efficiently at a high or low voltage is required in accordance to various demands requested from semiconductor manufacturing process; however, a prior remote plasma reactor adapting one of the transformer coupled plasma source or the inductively coupled plasma source is not appropriately responded to the demands.

Furthermore, as the process target-substrate becomes large, the process chamber becomes large and thus a plasma source that can supply sufficiently and remotely high density activated gas is demanded.

Meanwhile, a substrate treating system is provided, in which two or more process chambers are provided in parallel in order to treat two or more process target-substrates in parallel for increasing production efficiency of a semiconductor device. At this time, when the remotely activated ion gas is supplied to two or more process chambers, plasma reactors have been equipped separately to the respective process chambers. However, in this case, equipment cost is increased and operation cost becomes high.

However, when single plasma reactor is used for supplying the activated ion gas to two or more process chambers, a plasma reactor of a large capacity has to be used but ionized gas of a large capacity is difficult to be generated and supplied by using an existing plasma reactor.

Further, the different kinds of process gases are ionized more efficiently by separating them than by mixing them in accordance to the semiconductor manufacturing process; however, it is difficult to perform it in a single process chamber.

Meanwhile, the existing plasma reactor, specially the transformer coupled plasma source has a problem that power greater than a predetermined level (for example, 3 kw) has to be supplied to maintain plasma and when the power becomes to the predetermined level or less, the plasma cannot be maintained.

SUMMARY OF THE DISCLOSURE

The present invention has been made in an effort to solve the above-described problems associated with prior art. An object of the present invention is to provide a plasma reactor having multi discharging tubes, capable of supplying sufficiently and remotely the activated gas of a large capacity and a high density.

Another object of the present invention is to provide a plasma reactor having multi discharging tubes of a hybrid type to have a wide operational region from a low voltage region to a high voltage region by installing integrally the inductively coupled plasma source or the capacitively coupled plasma source, in addition to the transformer coupled plasma source.

Another object of the present invention is to provide a plasma reactor having multi discharging tubes, capable of providing two or more separated plasma discharging channels and generating independently ionized activated gas at the respective discharging channels to supply it to a process chamber.

Further, another object of the present invention is to provide a plasma reactor having multi discharging tubes, capable of operating efficiently two plasma sources with one power supply and driving alternatively one source in a combined configuration of the transformer coupled plasma source and other plasma sources or the combined source.

Additionally, another object of the present invention is to provide a plasma reactor having multi discharging tubes, capable of injecting different process gases into the multi discharging tubes of the plasma reactor of the present invention to perform processes including a cleaning process for semiconductor.

Another object of the present invention is to provide a plasma reactor having multi discharging tubes, capable of maintaining a plasma state even at a low power.

A plasma reactor having multi discharging tubes including: an upper hollow discharging tube having a gas inlet; a lower hollow discharging tube having a gas exit; a plurality of discharging tube bridges wherein an upper part and a lower part of each discharging tube bridge are coupled between the upper discharging tube and the lower discharging tube; a transformer coupled plasma source that is equipped on the discharging tube bridge and has a magnetic core on which a first winding coil is wound; and a AC switching power supply for supplying plasma generation power to the first winding coil.

The plasma reactor having multi discharging tubes further includes an inductively coupled plasma source having a dielectric flat window that is equipped to an upper opening formed a part of the upper discharging tube and an inductive antenna flat coil that is arranged adjacently to the dielectric flat window wherein the inductive antenna flat coil and the first winding coil are coupled to the AC switching power supply in parallel or in series.

The plasma reactor having multi discharging tubes further includes an inductively coupled plasma source having a dielectric tube that is arranged to be protruded upwardly to an upper discharging tube opening formed a part of the upper discharging tube and an inductive antenna that is wound on the dielectric tube wherein the inductive antenna and the first winding coil are coupled to the AC switching power supply in parallel or in series.

The plasma reactor having multi discharging tubes further includes a capacitively couples plasma source provided with capacitively coupled electrodes to be equipped to at least two upper discharging tube openings formed at a part of the upper discharging tube wherein the capacitively coupled electrodes and the first winding coil are coupled to the AC switching power supply in parallel or in series.

At least two gas exits of the lower discharging tube are provided wherein the gas in-flowed through the gas inlet and the discharging channel via the upper discharging tube, the lower discharging tube and the plurality of discharging tube bridges is activated by a plasma-discharging, distributed and supplied by the gas exits to at least two process chambers.

The plasma reactor having multi discharging tubes further includes an inductively coupled plasma source provided with a dielectric flat window that is equipped to an upper opening formed a part of the upper discharging tube and an inductive antenna flat coil that is arranged adjacently to the dielectric flat window wherein the inductive antenna flat coil and the first winding coil are coupled to the AC switching power supply in parallel or in series.

The plasma reactor having multi discharging tubes further includes an inductively coupled plasma source provided with the lower discharging tube opening that is formed a lower part of the lower discharging tube, a dielectric tube that is equipped to be protruded downwardly to the lower discharging tube opening, and an inductive antenna winding coil to be wound on the dielectric tube wherein the inductive antenna winding coil and the first winding coil are coupled to the AC switching power supply in parallel or in series.

The plasma reactor having multi discharging tubes of claim 1, comprising an inductively coupled plasma source provided with the upper discharging tube opening that is formed a lower part of the upper discharging tube, a dielectric tube that is equipped to be protruded downwardly to the upper discharging tube opening, and an inductive antenna to be wound on the dielectric tube wherein the inductive antenna and the first winding coil are coupled to the AC switching power supply in parallel or in series.

The plasma reactor having multi discharging tubes further includes an inductively coupled plasma source provided with the lower discharging tube opening that is formed an upper part of the lower discharging tube, a dielectric tube that is equipped to be protruded upwardly to the lower discharging tube opening, and an inductive antenna to be wound on the dielectric tube wherein the inductive antenna and the first winding coil are coupled to the AC switching power supply in parallel or in series.

The plasma reactor having multi discharging tubes further includes a capacitively coupled plasma source provided with a first and second openings which are formed on an upper part and a lower part of the upper discharging tube, respectively, upper capacitively coupled electrodes which are arranged to an upper part and a lower part of the first and second openings, respectively, a third and fourth openings which are formed on an upper part and a lower part of the lower discharging tube, respectively, and lower capacitively coupled electrodes which are arranged to an upper part and a lower part of the third and fourth openings, respectively wherein the upper and lower capacitively coupled electrodes and the first winding coil are coupled to the AC switching power supply in parallel or in series.

The plasma reactor having multi discharging tubes further includes at least one electric insulative members provided between the upper multi discharging tubes and the upper discharging tube, or between the multi discharging tubes and the lower discharging tube.

The upper discharging tube comprises a partition for dividing the inside thereof to have at least two independent discharging regions.

The lower discharging tube includes a partition for dividing the inside thereof to have at least two independent discharging regions.

The gas exit of the lower discharging tube includes: a plurality of adaptor coupled to two or more process chambers; and a gas valve that is provided to the adaptor and controls flow amount of the activated gas in-flowed into the process chamber.

The process chamber comprises exhaust valves which are provided to the exhaust tubes, respectively, and control exhaust flow amount.

The plasma reactor having multi discharging tubes further includes a plurality of gas inlets which are coupled separately to the two or more discharging regions of the upper discharging tube.

The plasma reactor having multi discharging tubes further includes a plurality of gas exits which are coupled separately to two or more discharging regions of the lower discharging tube.

BRIEF DESCRIPTION OF THE DRAWINGS

The above and other features of the present invention will now be described in detail with reference to certain exemplary embodiments thereof illustrated in the accompanying drawings which are given hereinbelow by way of illustration only, and thus are not limitative of the present invention, and wherein.

Figure 1:
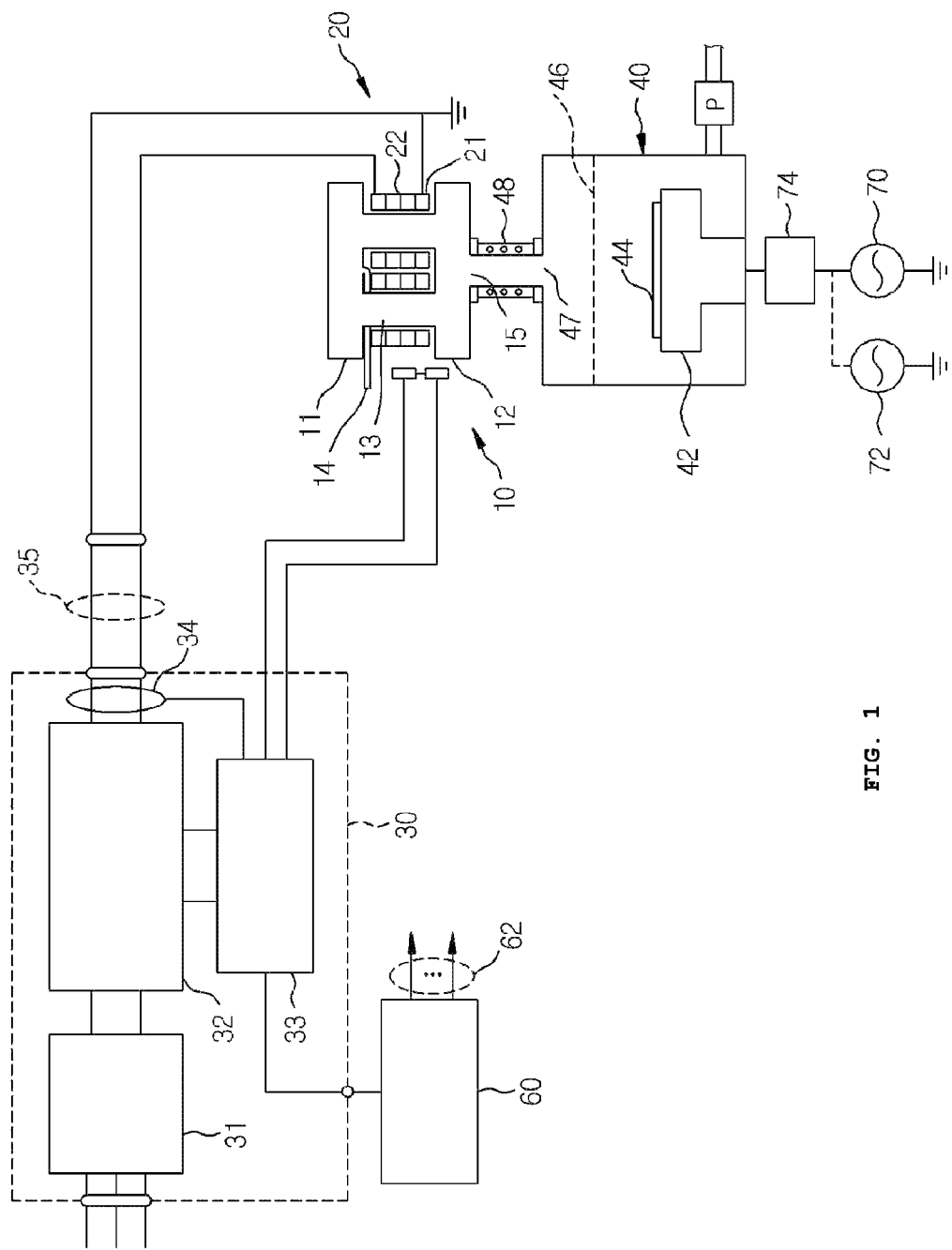
FIG. 1 is a block diagram illustrating a multi discharging tube plasma reactor according to the present invention and a plasma treating system provided therewith.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, a battery system for a vehicle according to an exemplary embodiment of the present invention will be described with reference to the accompanying drawings.

A plasma reactor 10 provided with multi discharging tubes according to the present invention is arranged on the outside of a process chamber 40, as shown FIG. 1 and thus plasma gas is supplied remotely to the process chamber 40. The plasma reactor 10 is provided with multi discharging tubes of an upper discharging tube 11, a lower discharging tube 12 and a plurality of discharging tube bridges 13.

Further, the plurality of discharging tube bridges 13 provides a plurality of discharging channels by coupling the upper discharging tube 11 and the lower discharging tube 12.

Here, a plurality of magnetic cores 22 each having a first winding coil 21 are equipped to the plurality of discharging tube bridges 13, respectively, to form a transformer coupled plasma source 20.

A gas inlet 14 is provided to the upper discharging tube 11 of the plasma reactor 10 and a gas exit 15 is provided to a central lower part of the lower discharging tube 12.

At this time, the gas exit 15 is coupled to a chamber gas inlet 47 through an adaptor 48 and the plasma gas generated in the plasma reactor 10 is supplied to the process chamber 40 through the adaptor 48.

Furthermore, the plasma reactor 10 is provided with the multi discharging tubes to generate plasma so that the plasma of a large capacity can be generated stably in a wide range from about 1 torr or less of a low pressure to about 10 torr or more of a high pressure.

Further, a substrate supporter 42 for supporting a process target-substrate 44 is provided in the process chamber 40 and the substrate supporter 42 may be coupled electrically to one or more bias power supply sources 70, 72 through an impedance matcher 74. The adaptor 48 may be provided with an insulation section for an electric insulation and a cooling channel for preventing over-heating. A baffle 46 for supplying the plasma gas may be provided between the substrate supporter 42 and the chamber gas inlet 47 in the process chamber 40.

The baffle 46 distributes uniformly and diffuses the plasma gas in-flowed through the chamber gas inlet 47 to the process-target substrate 44.

The process target-substrate 44 is, for example, a silicon wafer substrate, or glass substrate for fabricating liquid crystal display or plasma display, etc.

Further, a vacuum pump P for controlling the internal pressure of the process chamber 40 to a predetermined vacuum degree may be provided on one side of the process chamber 40.

Meanwhile, the transformer coupled plasma source 20 is operated by receiving wireless frequency from the power supply 30. The power supply 30 is provided with at least one switching semiconductor devices to include an AC switching power supply 32 for generating wireless frequency, a power control circuit 33 and a voltage supply 31. The at least one switching semiconductor devices, for example, may include at least one switching transistors. The power supply 31 converts alternative voltage supplied externally into a constant voltage and supplies it to the AC switching power supply 32. The Ac switching power supply 32 is operated through a control from the power control circuit 33 to generate wireless frequency.

Furthermore, the power control circuit 33 controls the operation of the AC switching power supply 32 to control voltage and current of the wireless frequency and further the control of the power control circuit 33 is performed based on electric or optical parameter value related to at least one transformer coupled plasma source 20 and the plasma generated in the plasma reactor 10. For this purpose, the power control circuit 33 is provided with a measurement circuit for measuring the electric or optical parameter value. For example, the measurement circuit for measuring the electric and optical parameter of the plasma includes a current probe and an optical detector. The measurement circuit for measuring electric parameter of the transformer coupled plasma source 20 measures a driving current, a driving voltage and average power and maximum power of the transformer coupled plasma source 20, and the voltage generated from the voltage supply 31.

The power control circuit 33 monitors continuously the related electric or optical parameter value through the measurement circuit and controls the AC switching power supply 32 while comparing the measured value to a reference value for a normal operation thereby controlling the voltage and current of the wireless frequency. Even though it is not shown concretely, a protection circuit may be provided on the power supply 30 in order to prevent electric loss that may be produced from an abnormal operation environment. The power supply 30 is coupled to a system controller 60 for controlling entirely the plasma treating system. The power supply 30 provides the operation state information of the plasma reactor 10 to the system controller 60. The system controller 60 generates a control signal 62 for controlling entirely the operation of the plasma treating system and controls the operations of the plasma reactor 10 and the process chamber 40.

The plasma reactor 10 and the power supply 30 are separated physically. That is, the plasma reactor 10 and the power supply 30 are coupled electrically each other through a wireless frequency supply cable 35. Through this separated configuration of the plasma reactor 10 and the power supply 30, they can be easily maintained and repaired. However, the plasma reactor 10 and the power supply may be formed integrally.

Figure 2:
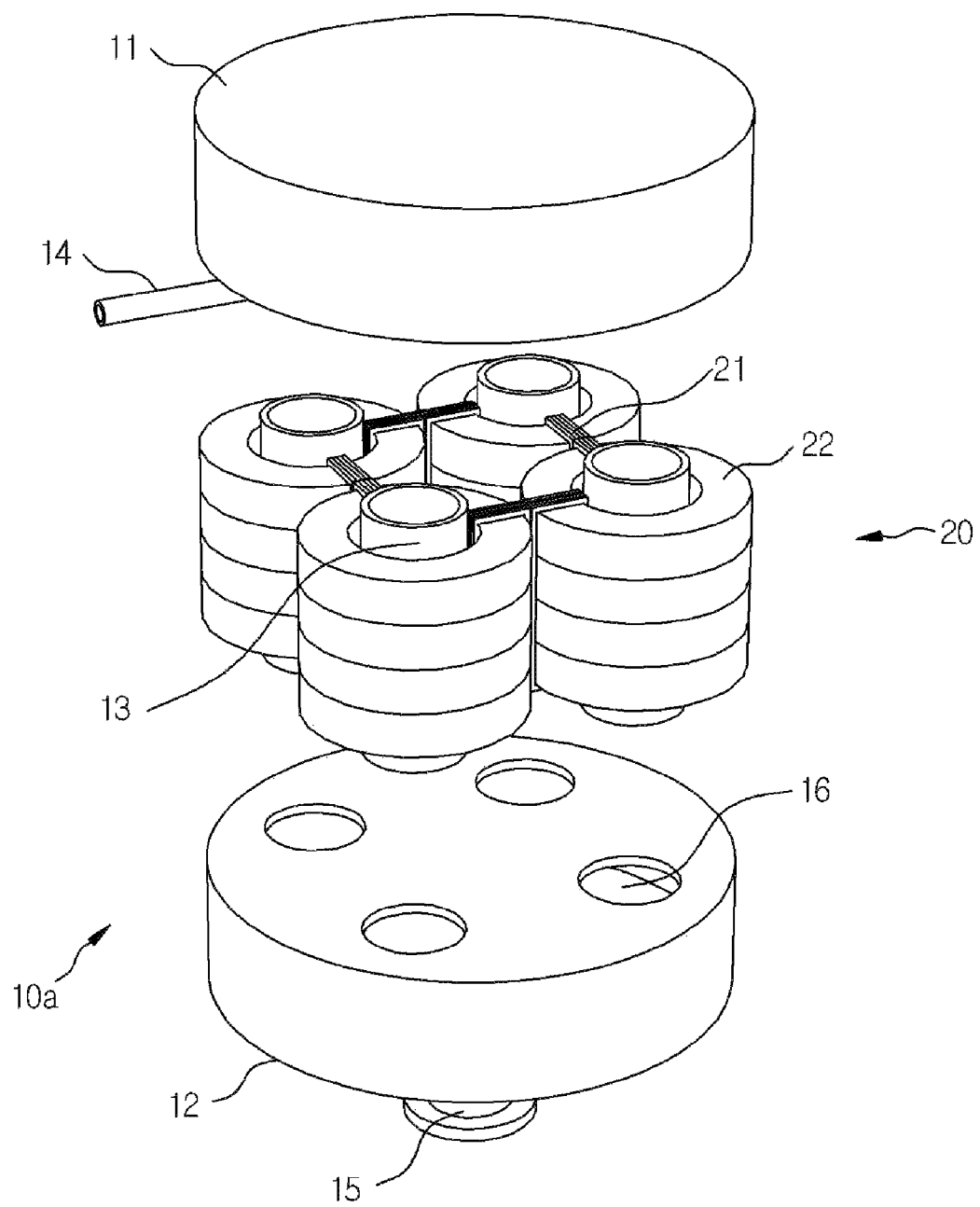
FIG. 2 is an exploded perspective view illustrating a multi discharging tube plasma reactor according to a first embodiment of the present invention.
Figure 3:
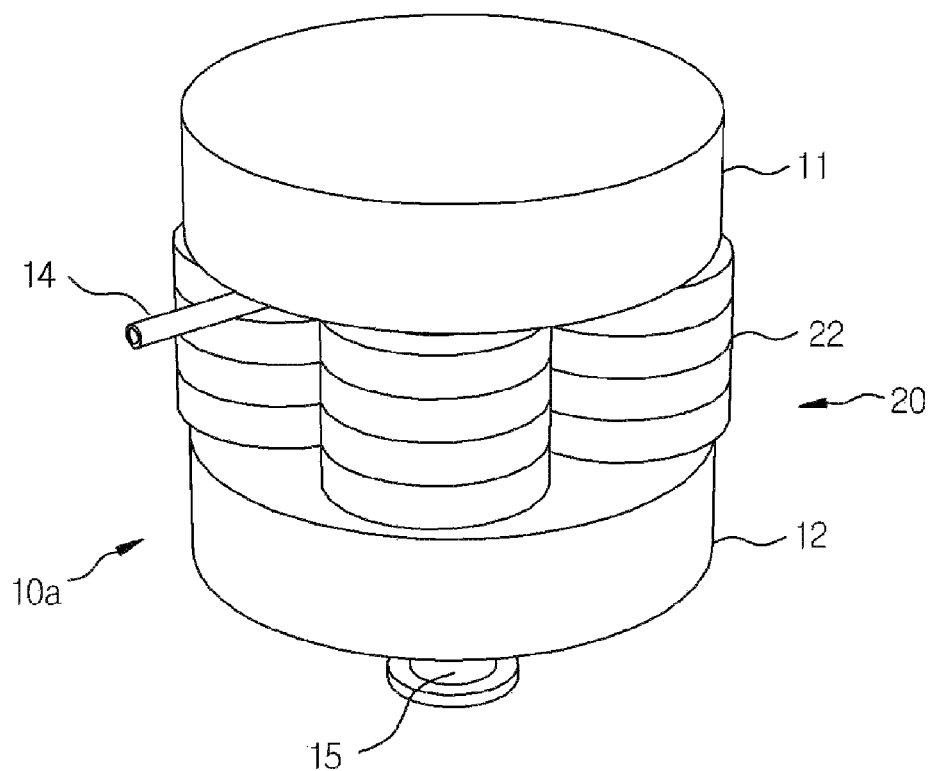
FIG. 3 is a perspective view illustrating the assembled multi discharging tube plasma reactor as shown in FIG. 2.
Figure 4:
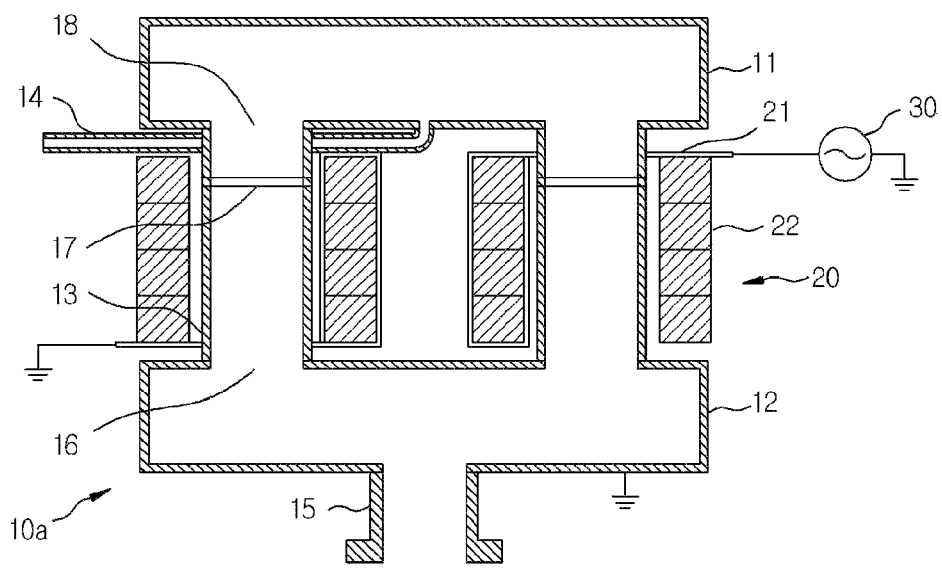
FIG. 4 is a cross-sectional view illustrating the multi discharging tube plasma reactor as shown in FIG. 2.

A multi discharging tube plasma reactor 10a according to a first embodiment of the present invention, as shown in FIGS. 2 to 4, supplies remotely plasma gas to the process chamber 40. The plasma reactor 10a is provided with multi discharging tubes of an upper discharging tube 11, a lower discharging tube 12 and a plurality of discharging tube bridges 13. For example, four discharging tube bridges 13 provide a plurality of discharging channels by coupling an upper opening 18 of the upper discharging tube 11 and a lower opening 16 of the lower discharging tube 12. Here, the magnetic cores 22 each having the first winding coil 21 are equipped to the plurality of discharging tube bridges 13, respectively, to form a transformer coupled plasma source 20. The magnetic core 22 may not be equipped to all of the discharging tube bridges 13, and further the number of the discharging bridges 13 may be increased or decreased.

Figure 5:
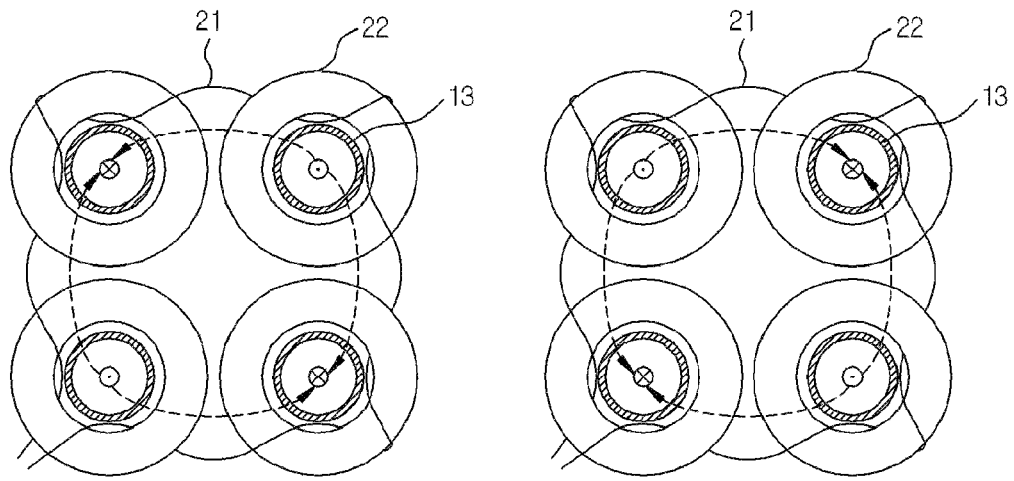
FIG. 5 is a view illustrating exemplarily inductive magnetic flux in accordance to the current flowed through a first winding coil that is wound on a magnetic core as shown in FIG. 2.
Figure 6:
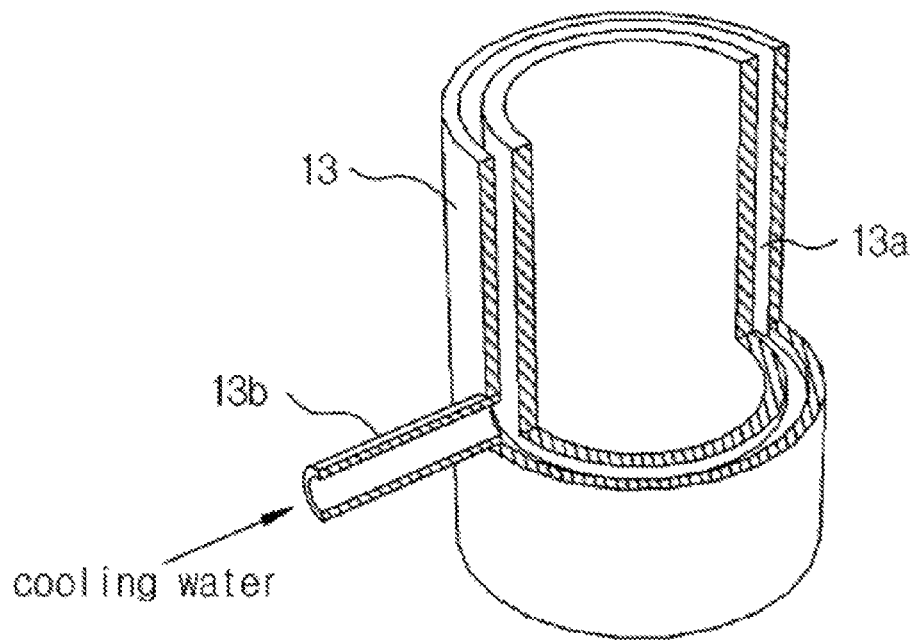
FIG. 6 is a partially exploded perspective view illustrating exemplarily the multi discharging tube plasma reactor wherein a cooling water channel is provided to a discharging tube bridge of the reactor.

When four discharging bridges 13 are provided and the magnetic cores 22 having the first winding coil 21 are equipped to the respective discharging tube bridges 13, the magnetic flux directions that are varied in accordance to a direction of the current flowing through the first winding coil 21 are shown exemplarily in FIG. 5. As shown in FIG. 5, the magnetic flux of one discharging tube bridge 13 is induced as the same direction as the facing discharging tube bridge and as an opposing direction to the adjacent discharging tube bridge so that the adjacent discharging tube bridges 13 form the discharging channels as a pair. The discharging tube bridge has a tube structure wherein a cooling water channel 13a is provided therein and a cooling water inlet 13b is provided on an outside thereof, as shown in FIG. 6.

The upper discharging tube 11 is provided with a gas inlet 14 and the lower discharging tube 12 is provided with a gas exit 15 coupled to the process chamber 40. When process gas is supplied from a gas supply (not shown), the gas in-flowed into the upper discharging tube 11 is distributed through a plurality of discharging tube bridges 13 to be flowed into the lower discharging tube 12. When power for generating plasma is supplied from the power supply 30 to the first winding coil 21, the plasma discharging is performed via the upper discharging tube 11, the plurality of discharging tube bridges 13 and the lower discharging tube 12.

The plasma reactor 10a according to the first embodiment of the present invention has a multi discharging tube configuration and the magnetic cores 22 having the first winding coil 21 are equipped to the plurality of discharging tube bridges 13, respectively, and thus activated gas of a large capacity can be generated. The upper discharging tube 11, the lower discharging tube 12 and the plurality of discharging tube bridges 13 may be made of metal material such as aluminum, stainless steel or copper. Further, they may be made of coated metal such as anodized aluminum or nickel plated aluminum.

When the upper discharging tube 11, the lower discharging tube 12 and the plurality of discharging tube bridges 13 are fabricated entirely with metal material, an insulation gap 17 may be provided at a proper location. For example, the insulation gap 17 may be provided between the upper discharging tube 11 and the discharging tube bridge 13, or between the lower discharging tube 12 and the discharging tube bridge 13. Further, the insulation gap 17 may be provided on a middle region of the discharging tube bridge 13. When the insulation gap 17 is provided, a vortex flow can be prevented from being induced in the plasma reactor 10a along the plasma discharging channel.

The upper discharging tube 11, the lower discharging tube 12 and the plurality of discharging tube bridges 13 may be made of composite metal that is covalent-bonded with carbon nano tube. Further, they may be made of refractory metal. Additionally, they may be made entirely or partially of electric insulative material such as quartz or ceramic. The plasma reactor 10a may be made of any material proper for performing intended plasma process.

The plasma reactor 10a may be shaped in accordance to the process-target substrate 13 and a proper configuration to generate uniform plasma, for example, circular configuration or quadrangle configuration, or any configurations. The process target-substrate 44 may be a wafer substrate, a glass substrate or a plastic substrate, etc., for manufacturing a semiconductor device, a display device and solar cell, etc.

Even though it is not shown in the drawings, a partition may be provided in the plasma reactor 10a between the upper discharging tube 11 and the lower discharging tube 12 to provide two or more independent discharging regions. A plurality of gas inlets are coupled to the upper discharging tubes 11, corresponding to the respective independent discharging regions to activate the different gases at the independent discharging regions, respectively, and supply them to the process chamber 40. The configuration of the reactor as described-above is efficiently used in case where process efficiency is decreased or problematic while the different gases are mixed to be ionized.

Figure 7:
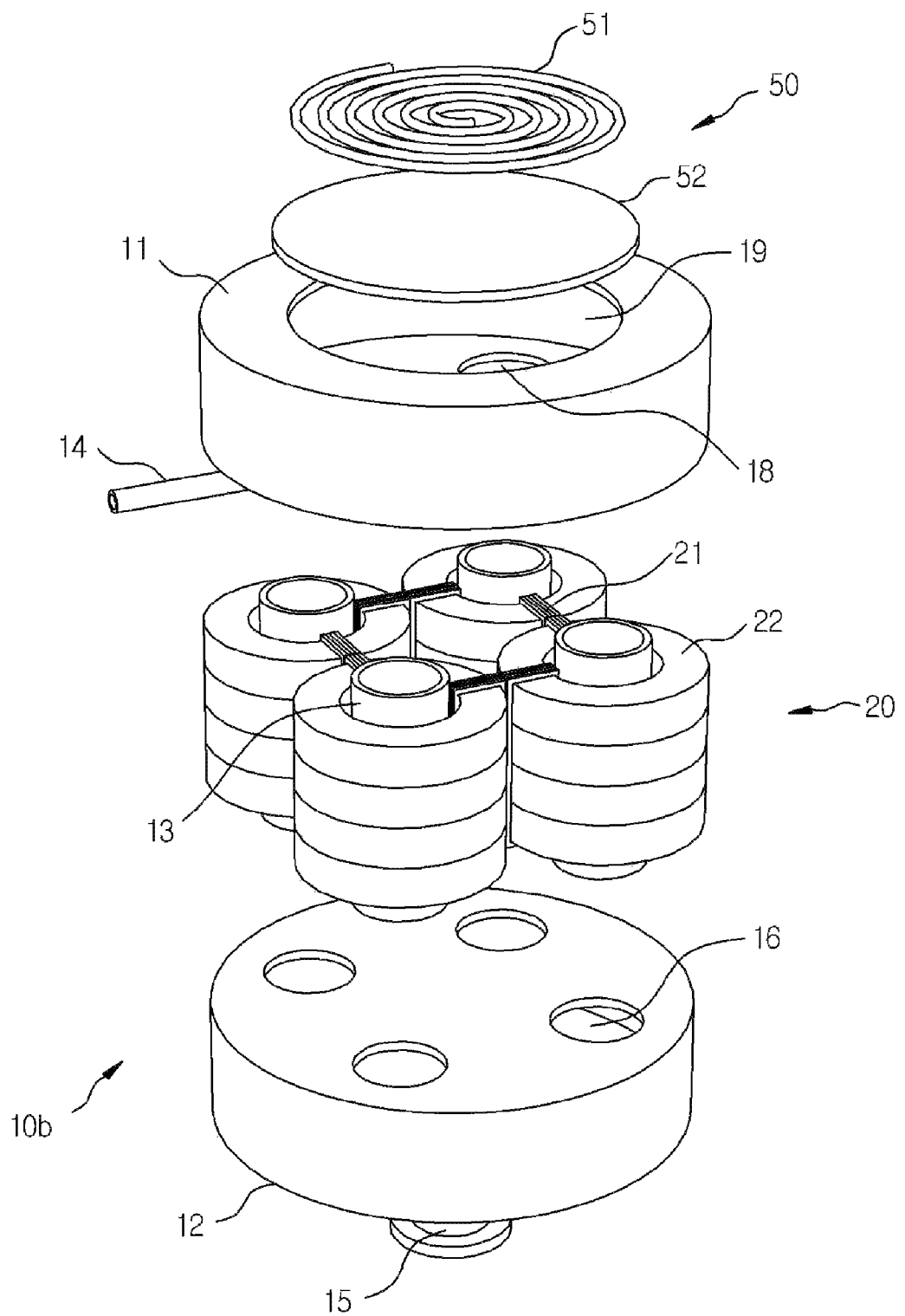
FIG. 7 is an exploded perspective view illustrating a multi discharging tube plasma reactor according to a second embodiment of the present invention.
Figure 8:
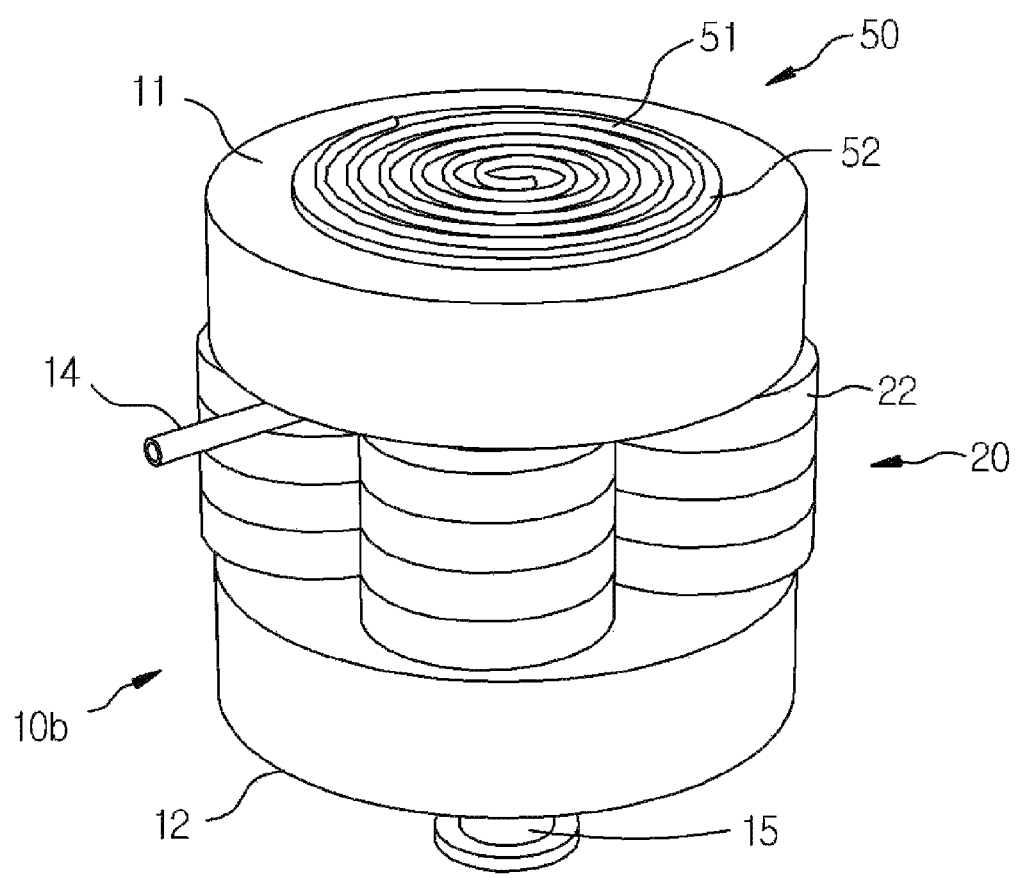
FIG. 8 is a perspective view illustrating the assembled multi discharging tube plasma reactor as shown in FIG. 7.
Figure 9:
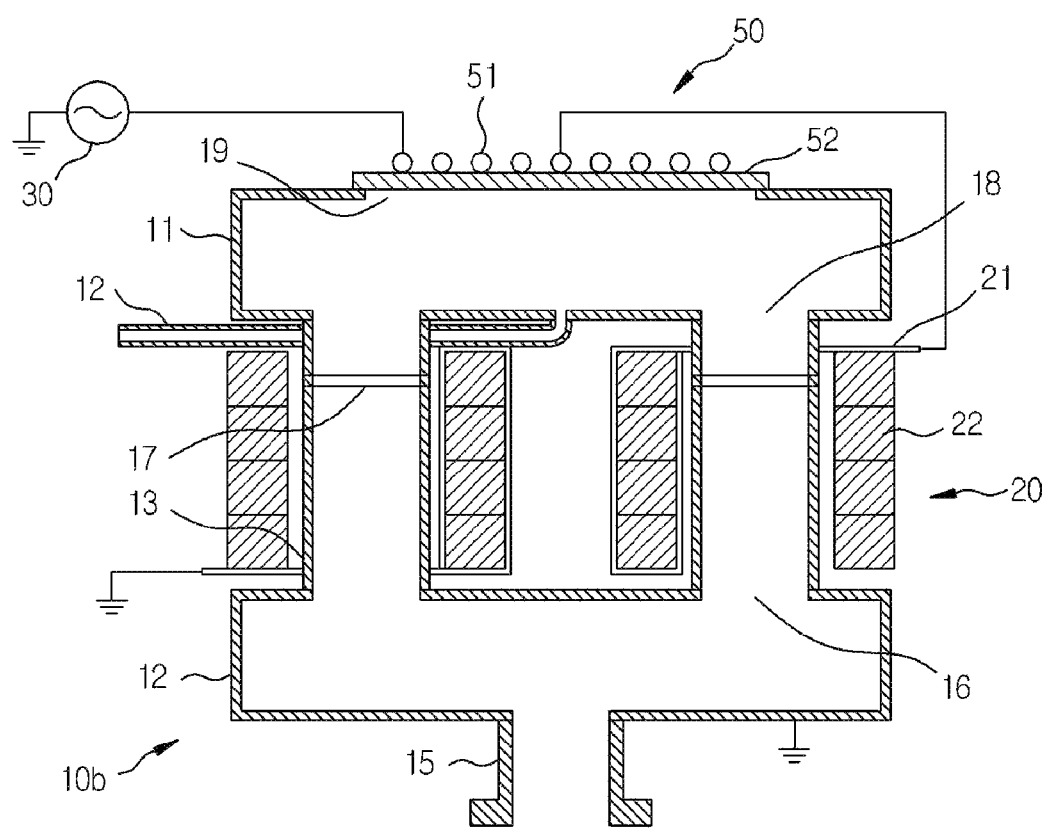
FIG. 9 is a cross-sectional view illustrating the multi discharging tube plasma reactor as shown in FIG.
Figure 10:
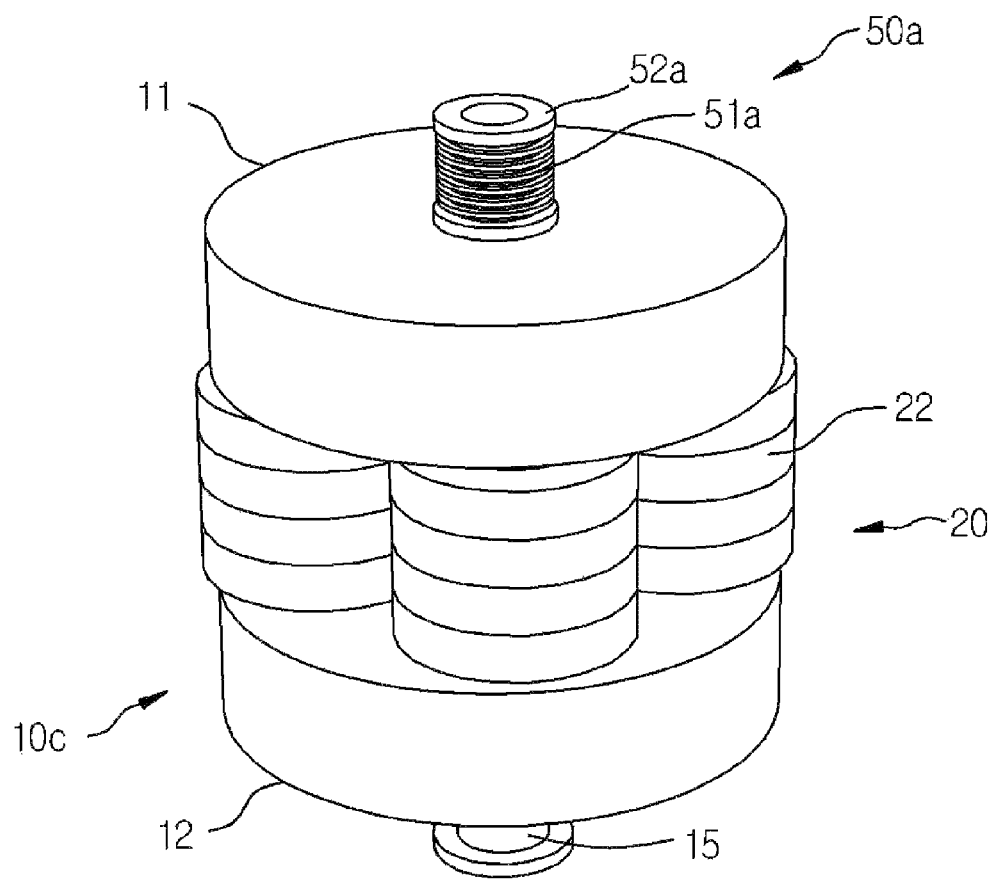
FIG. 10 is a perspective view illustrating a multi discharging tube plasma reactor according to a third embodiment of the present invention.
Figure 11:
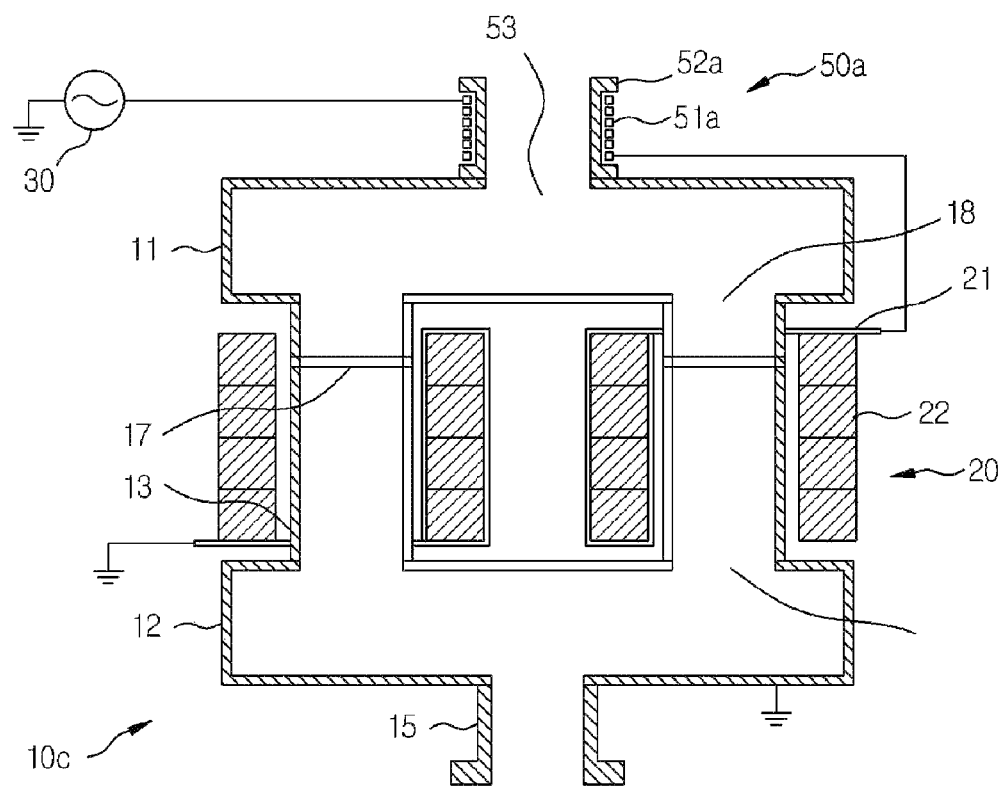
FIG. 11 is a cross-sectional view illustrating the multi discharging tube plasma reactor as shown in FIG. 10.

A multi discharging tube reactor 10b according to a second embodiment of the present invention, as shown in FIGS. 7 to 9, has basically the same configuration as the plasma reactor 10a according to the first embodiment of the present invention. However, in the plasma reactor 10b of the second embodiment, an inductively coupled plasma source 50 is provided on an external ceiling of the upper discharging tube 11. An opening 19 for arranging a window is provided on a ceiling of the upper discharging tube 11 and further a dielectric flat window 52 to cover the opening 19 is provided. An inductive antenna flat coil 51 is provided adjacent to the dielectric window 52.

The inductive antenna flat coil 51 of the inductively coupled plasma source 50 and the first winding coil 21 of the transformer coupled plasma source 20 are connected to the power supply 30 in series. However, the inductive antenna flat coil 51 and the first winding coil 21 may be connected to the power supply 30 in parallel. Additionally, a switching circuit (not shown) may be provided for connecting them to the power supply in series or parallel, or connecting alternatively one of two to the power supply.

When the inductively coupled plasma source 50 is added, a wide operational region of the reactor from a low voltage region to a high voltage region can be obtained stably. A plasma ignition can be generated easily and kept at the low voltage region by the inductively coupled plasma source 50 and further plasma of a large capacity can be kept at the high voltage region without damage to the inside of the reactor by the transformer coupled plasma source 20. Two plasma sources can be operated efficiently with one power supply and further in a combined configuration of the inductively coupled plasma source 50 and the transformer coupled plasma source 20, only one source may be driven alternatively or the combined source may be driven.

Meanwhile, in a multi discharging tube plasma reactor 10c according to a third embodiment of the present invention, unlike to the second embodiment as described-above, the inductively coupled plasma source 50b is provided to the upper discharging tube 11 to be co-used as a gas inlet. A dielectric tube 52a to be co-used as the gas inlet is arranged to the upper discharging tube 11 and an inductive antenna winding coil 51a is arranged to the dielectric tube 52a, and thus the gas in-flowed through the dielectric tube 52a is plasma-discharged at the moment while passing through the dielectric tube 52a.

Figure 12:
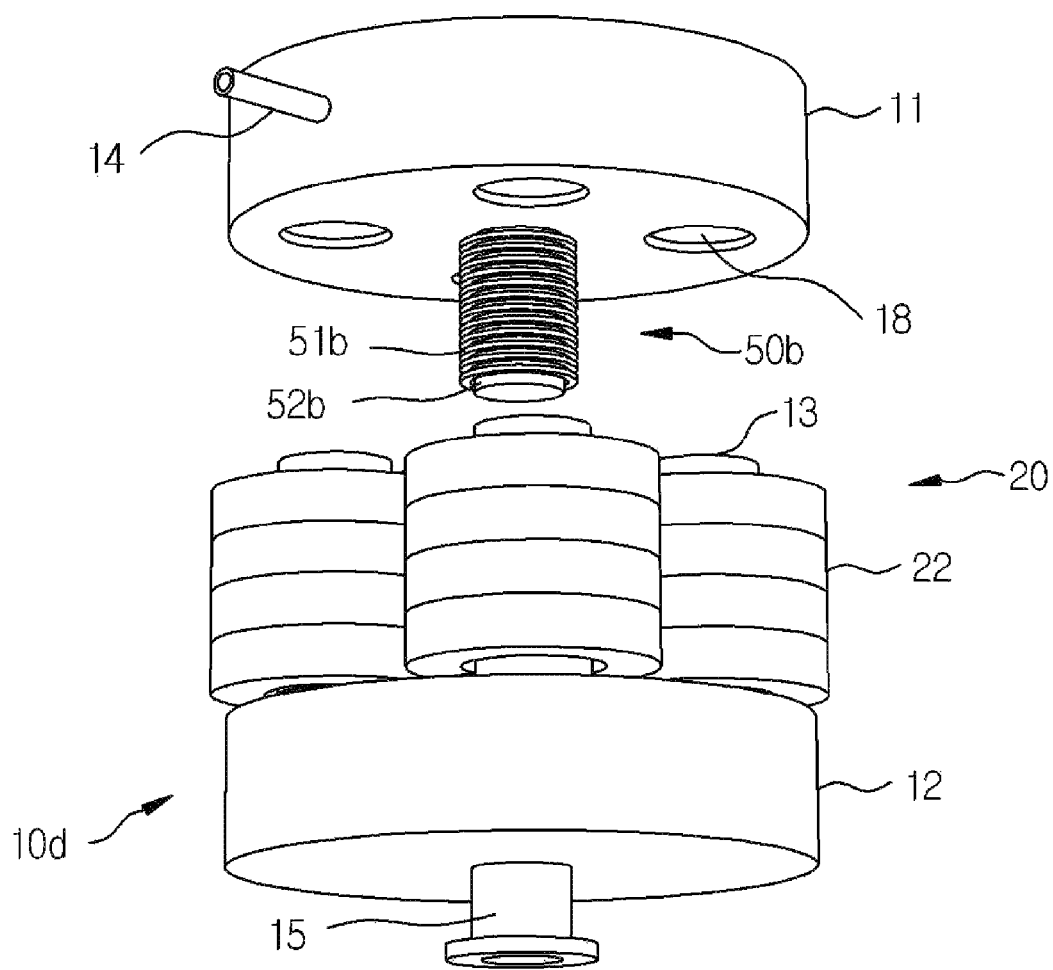
FIG. 12 is a perspective view illustrating a multi discharging tube plasma reactor according to a fourth embodiment of the present invention.
Figure 13:
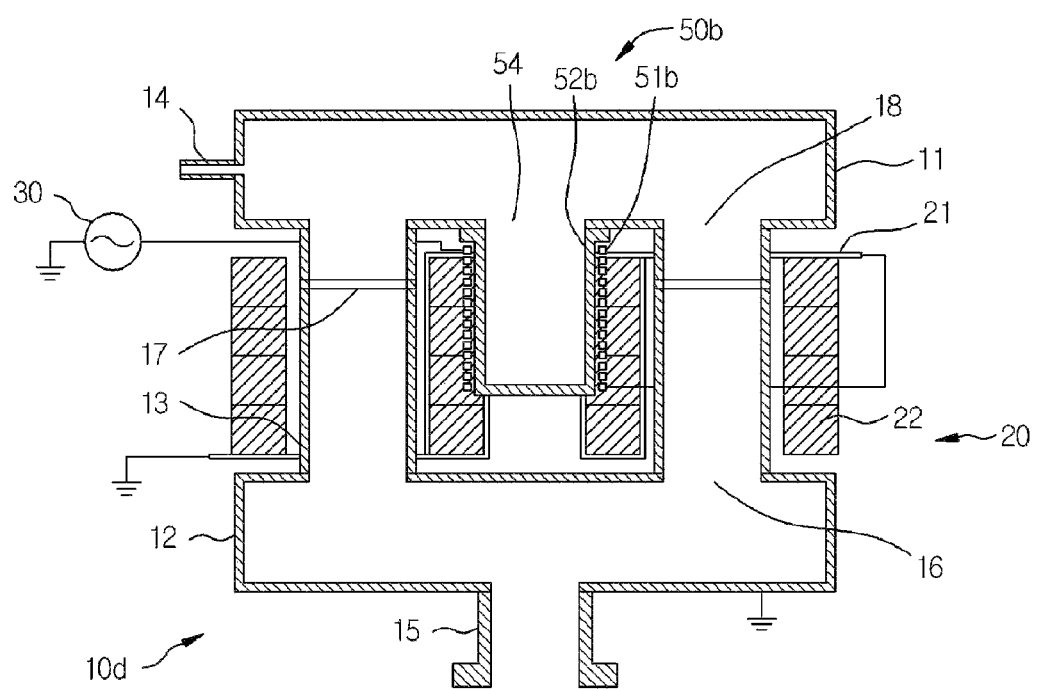
FIG. 13 is a cross-sectional view illustrating the multi discharging tube plasma reactor as shown in FIG. 12.

In a multi discharging tube plasma reactor 10d according to a fourth embodiment of the present invention, as shown in FIGS. 12 and 13, unlike to the third embodiment, the dielectric tube 52b is not co-used as a gas inlet. An upper discharging tube opening 54 is provided on a bottom of the upper discharging tube 11 and the dielectric tube 52b and the inductive antenna winding coil 51b are equipped to the opening.

Since plasma is maintained continuously and partially on the inside of the upper discharging tube 11 by the inductively coupled plasma source 50b, plasma discharging maintaining efficiency can be improved.

Figure 14:
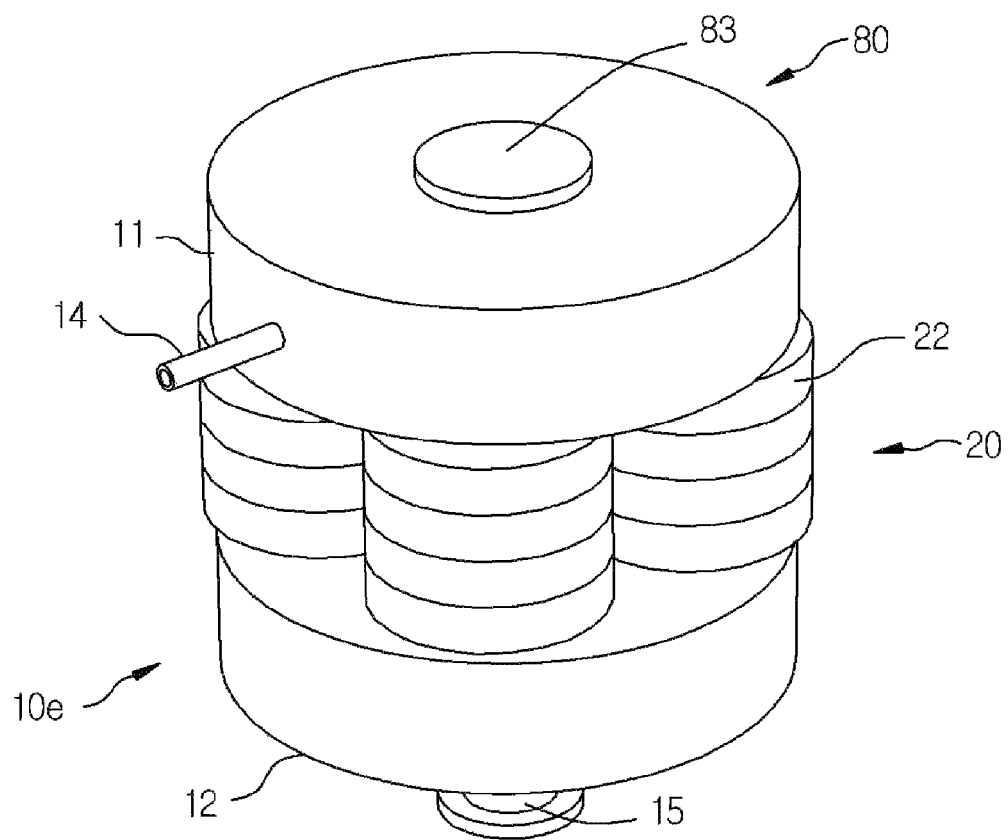
FIG. 14 is a perspective view illustrating a multi discharging tube plasma reactor according to a fifth embodiment of the present invention.
Figure 15:
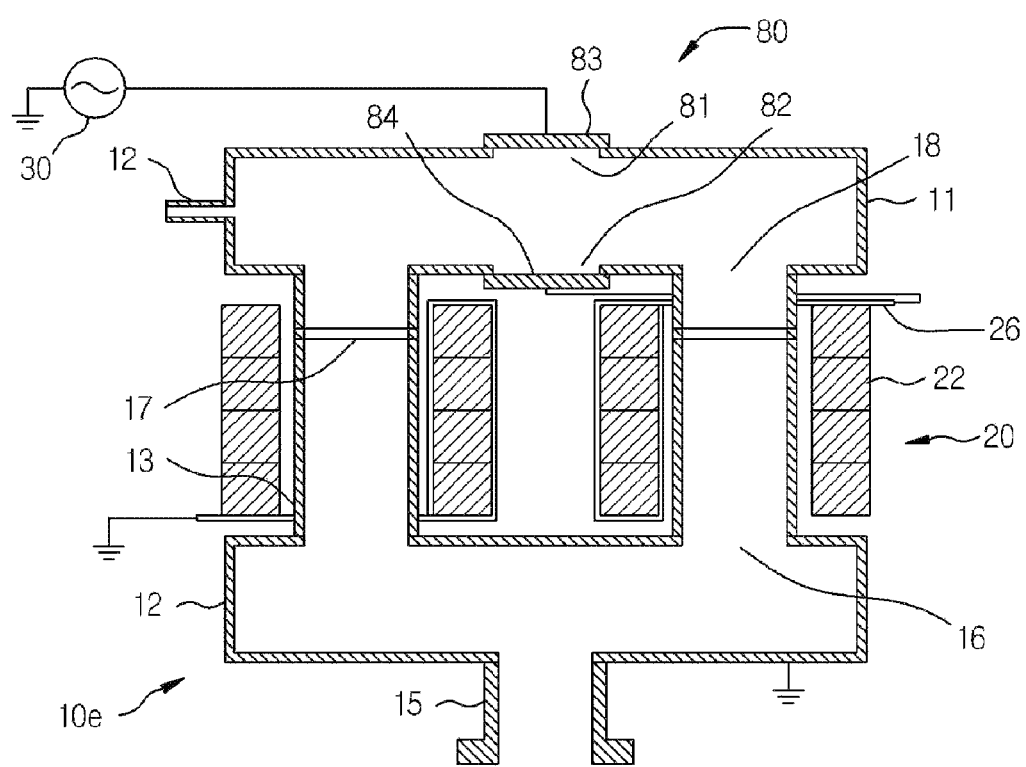
FIG. 15 is a cross-sectional view illustrating the multi discharging tube plasma reactor as shown in FIG. 14.

Meanwhile, a plasma reactor 10e according to a fifth embodiment of the present invention has basically the same configuration as the plasma reactor 10a in the first embodiment, as shown in FIGS. 14 and 15. However, in the plasma reactor 10e of the fifth embodiment, a first and second openings 81, 82 are provided on a ceiling and a bottom of the upper discharging tube 11, respectively, and a capacitively coupled plasma source 80 is provided with upper capacitively coupled electrodes 83, 84 which are arranged to the openings. The upper capacitively coupled electrodes 83, 84 of the capacitively coupled plasma source 80 and the first winding coil 26 of the transformer coupled plasma source 20 are connected to the power supply 30 in series. However, the upper capacitively coupled electrodes 83, 84 and the first winding coil 26 may be connected to the power supply in parallel. Additionally, a switching circuit (not shown) may be provided for connecting them to the power supply in series or parallel, or connecting one of two to the power supply.

When the capacitively coupled plasma source 80 is added, a wide operational region of the reactor from a low voltage region to a high voltage region can be obtained stably. A plasma ignition can be generated easily and kept at the low voltage region by the capacitively coupled plasma source 80 and further plasma of a large capacity can be kept at the high voltage region without damage to the inside of the reactor by the transformer coupled plasma source 20. Two plasma sources can be operated efficiently with one power supply and further in a combined configuration of the capacitively coupled plasma source 80 and the transformer coupled plasma source 20, only one source may be driven alternatively or the combined source may be driven.

Figure 16:
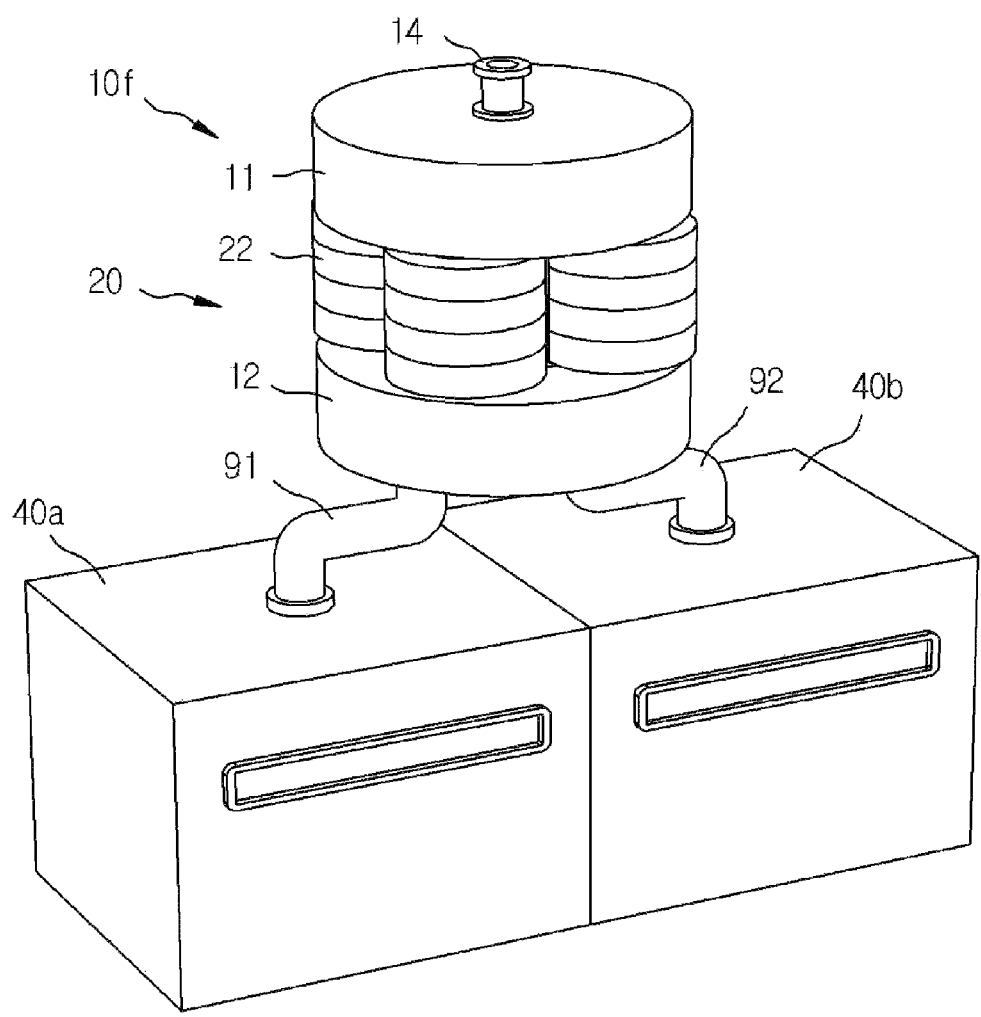
FIG. 16 is a perspective view illustrating a dual process chamber equipped with the multi discharging tube plasma reactor according to a sixth embodiment of the present invention.
Figure 17:
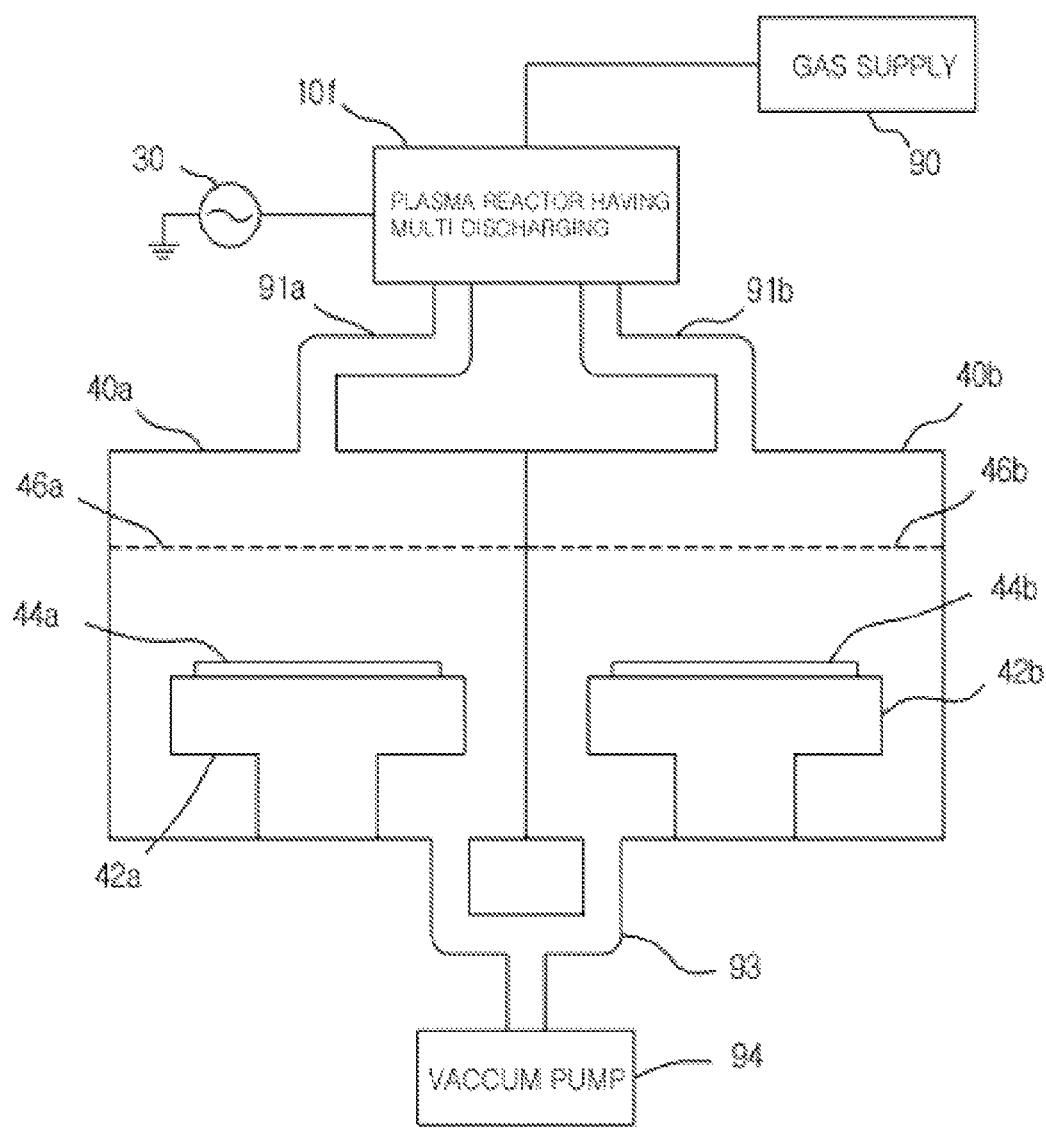
FIG. 17 is a cross-sectional view illustrating the inside of the dual process chamber as shown in FIG. 16.

Meanwhile, a plasma reactor 10f according to a sixth embodiment of the present invention has basically the same configuration as the plasma reactor 10a in the first embodiment, as shown in FIGS. 16 and 17. However, the gas inlet 14 is arranged on a ceiling of the upper discharging tube 11, and the lower discharging tube has two gas exits (not shown). Two gas exits are connected to two process chambers 40a, 40b, respectively, through the respective adaptors 91, 92. Two process chambers perform independently substrate treating process. Here, the baffles 46a, 46b for distributing gas and the substrate supporters 42a, 42b on which the process target-substrates 44a, 44b are disposed are provided on the inside of the two process chambers 40a, 40b, respectively. In the two process chambers 40a, 40b, an exhaust tube 93 for discharging gas is connected to a vacuum pump 94.

Figure 18:
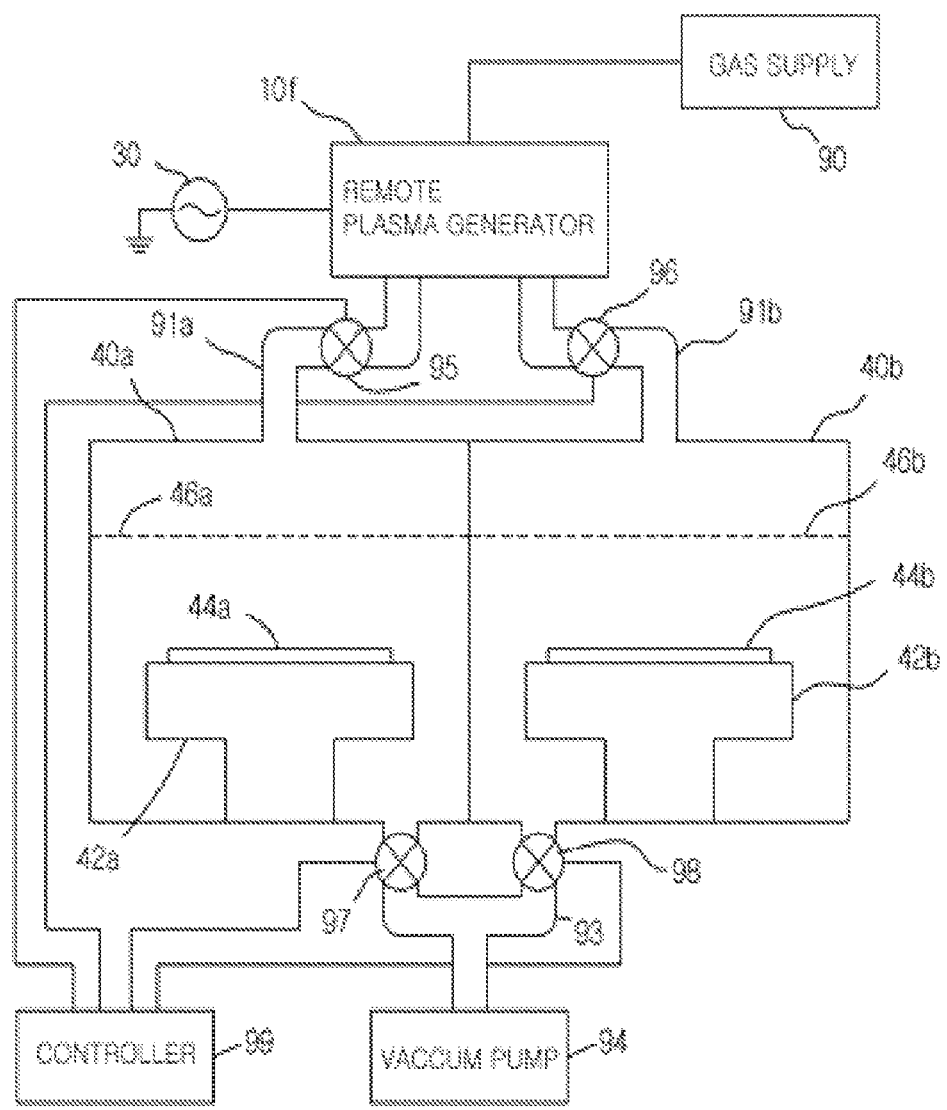
FIG. 18 is a perspective view illustrating exemplarily a gas vale of an adaptor coupled to the dual process chamber and an exhaust valve added to an exhaust tube.

Furthermore, as shown in FIG. 18, the gas valves 95, 96 are provided to the two adaptors 91a, 91b, respectively, to control independently flow amount of the activated gas in-flowed into two process chambers 40a, 40b. Further, the respective exhaust valves 97, 98 are provided on the exhaust tube 93 to control independently exhaust amount.

Figure 19:
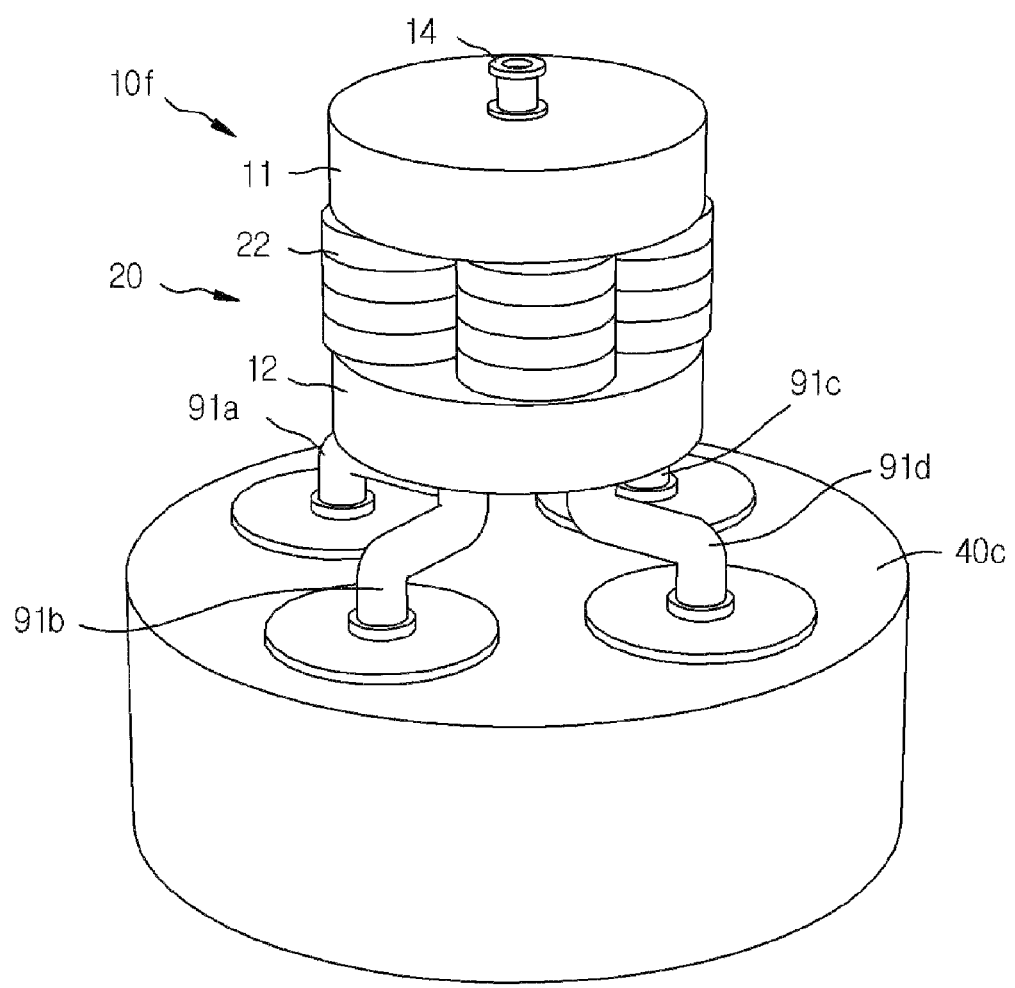
FIG. 19 is a perspective view illustrating a multi discharging tube plasma reactor and a process chamber for multi treating according to a seventh embodiment of the present invention.

As described-above, two or more gas exits are arranged to the lower discharging tube 12 of the plasma reactor 10f and it is possible to supply multiply the activated gas to two or more process chambers. For example, as shown in FIG. 19, in the multi discharging tube plasma reactor according to a seventh embodiment of the present invention, four gas exits (not shown) are provided to the lower discharging tube 12 and four adaptors 91a-91d are coupled to them, respectively, and they may be used in a process chamber 40c for multi treating simultaneously four process target-substrates.

The plasma reactor 10f of a multi discharging tube configuration can generate activated gas of a large capacity and thus a plurality of gas exits necessary to the lower discharging tube 12 are provided to supply simultaneously activated gas to a plurality of process chambers. If necessary, a gas valve may be provided on the adaptor to control flow amount of the gas supplied, and when it is not necessary to supply the activated gas, the gas valve is cut off to stop alternatively the supply of the activated gas.

Like in the embodiments as described-above, plasma generation efficiency and control efficiency can be increased by adapting the inductively coupled plasma source 50, 50a, 50b or the capacitively coupled plasma source 80 together with the transformer coupled plasma source 20. A partition is provided on the upper discharging tube 11 and the lower discharging tube 12 to form independent discharging channels, respectively, and further the gas inlets are connected individually to supply separately different gases for generating activated gas.

Figure 21:
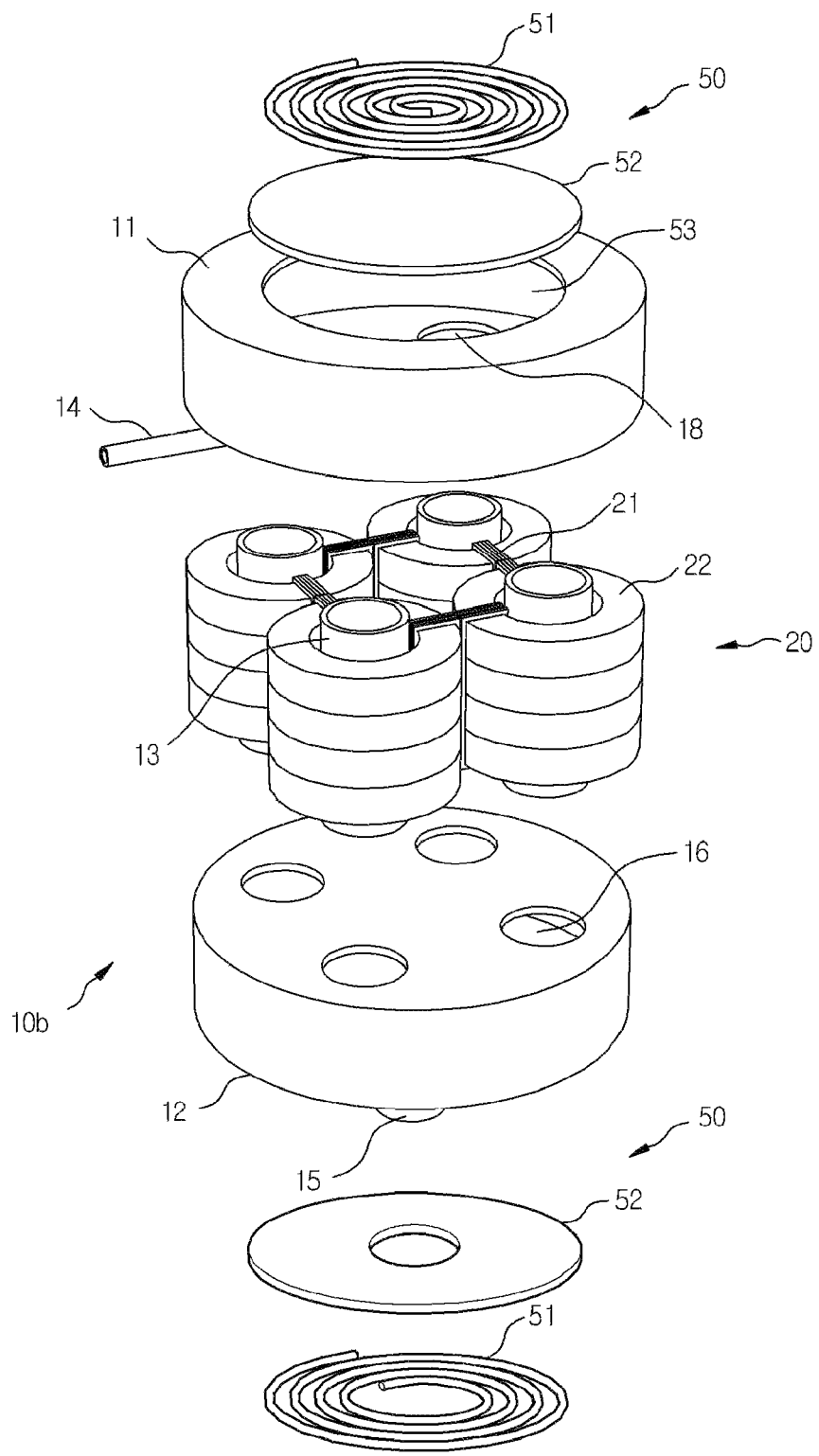
FIG. 21 an exploded perspective view illustrating the multi discharging tube plasma reactor according to eighth embodiment of the present invention as shown in FIG. 20.
Figure 22:
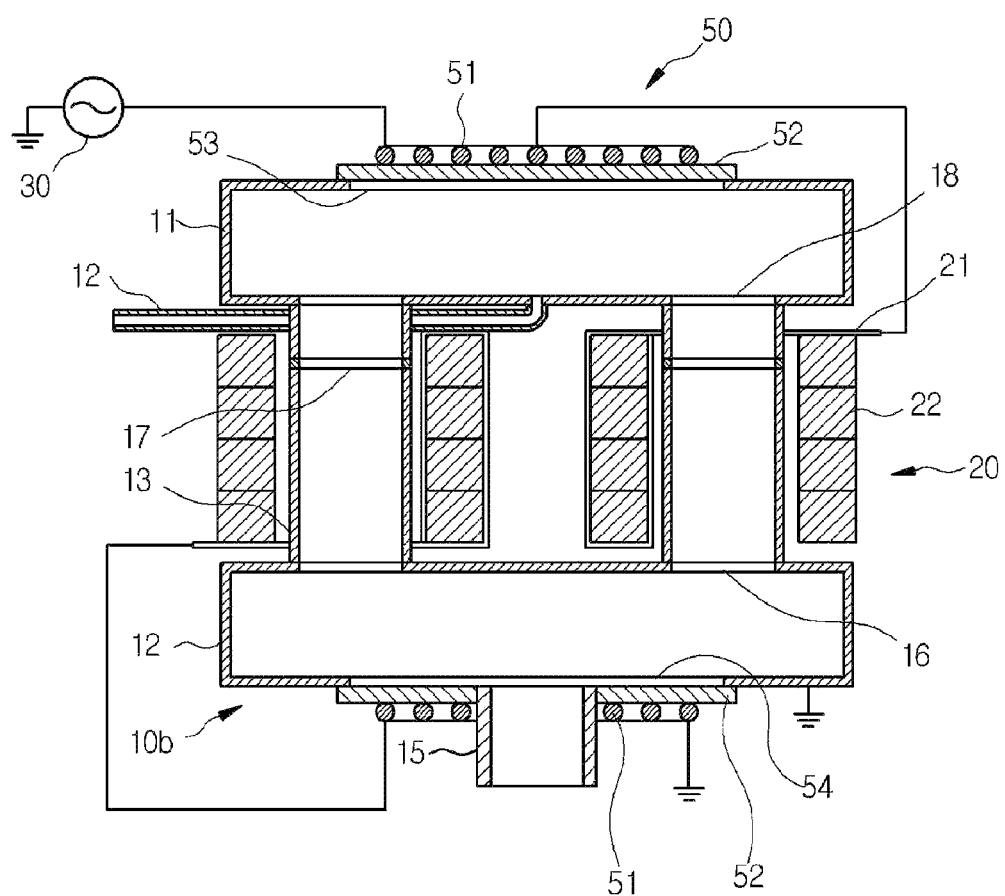
FIG. 22 is a cross-sectional view illustrating the multi discharging tube plasma reactor as shown in FIG. 21.

Meanwhile, a multi discharging tube plasma reactor 10b according to a eighth embodiment of the present invention, as shown in FIGS. 21 and 22, the inductively coupled plasma source 50 is arranged to an upper part of the upper discharging tube 11 and a lower part of the lower discharging tube 12. The upper discharging tube opening 53 for arranging a window is provided on an upper part of the upper discharging tube 11 and the upper discharging tube opening 54 is provided on a lower part of the lower discharging tube 12.

Further, the dielectric flat window 52 is provided on the upper discharging tube opening 53 and the lower discharging tube opening 54 to cover the openings 53, 54. The inductive antenna flat coils 51 are arranged, respectively, adjacent to the dielectric flat window 52.

Figure 20:
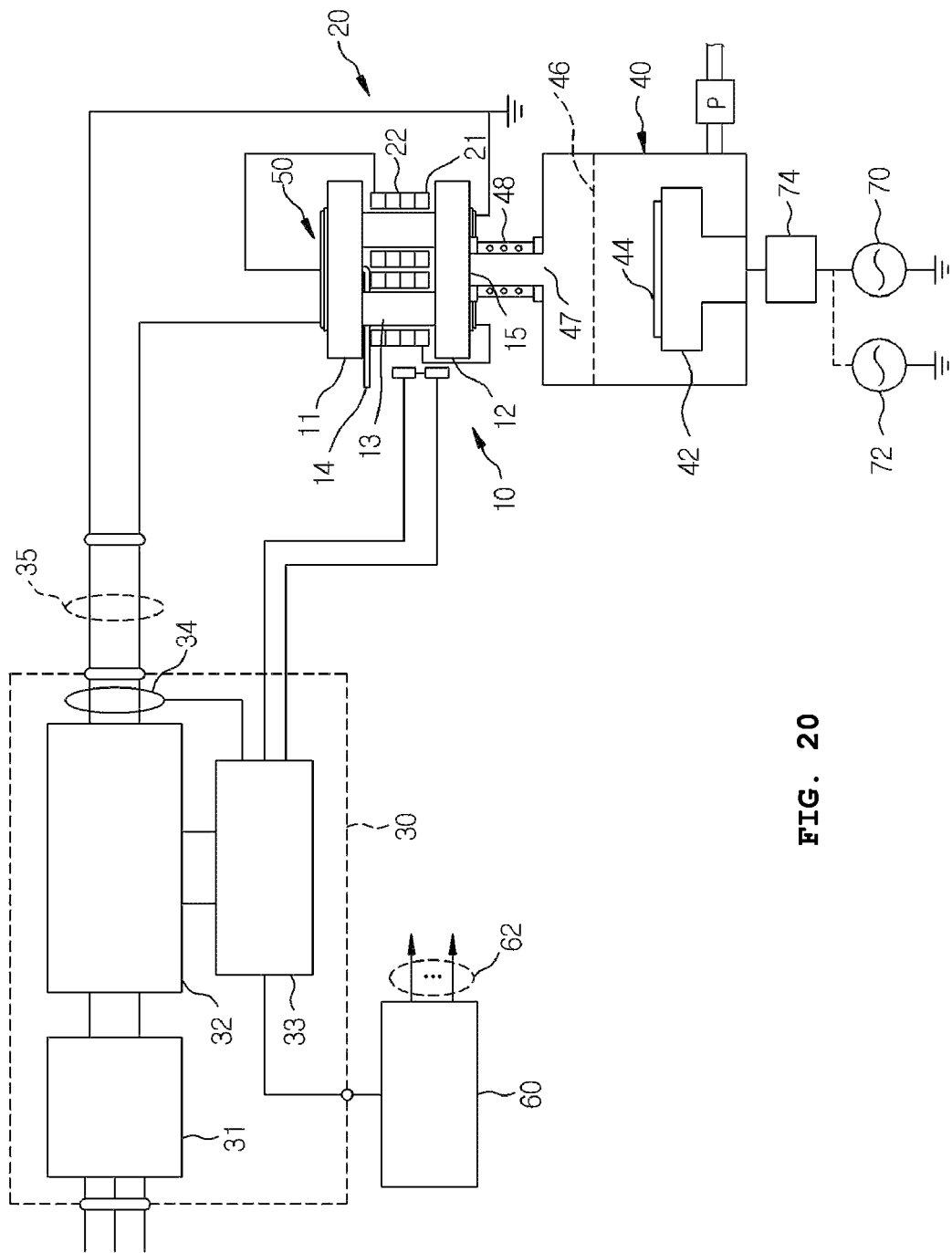
FIG. 20 is a block diagram illustrating a plasma treating system of a multi discharging tube plasma reactor according to eighth embodiment of the present invention.

Furthermore, the inductive antenna flat coil 51 of the inductively coupled plasma source 50 and the first winding coil 21 of the transformer coupled plasma source 20 are connected to the power supply 30 in series, as shown in FIG. 20. However, the inductive antenna flat coil 51 and the first winding coil 21 may be connected to the power supply 30 in parallel. Additionally, a switching circuit (not shown) may be provided for connecting them to the power supply in series or parallel, or connecting one of two to the power supply.

When the inductively coupled plasma source 50 is added as described-above, a wide operational region of the reactor from a low voltage region to a high voltage region can be obtained stably. A plasma ignition can be generated easily and kept at the low voltage region by the inductively coupled plasma source 50 and further plasma of a large capacity can be kept at the high voltage region without damage to the inside of the reactor by the transformer coupled plasma source 20.

Furthermore, two plasma sources 20, 50 can be operated efficiently with one power supply and further in a combined configuration of the inductively coupled plasma source 50 and the transformer coupled plasma source 20, only one source may be driven alternatively or the combined source may be driven.

Figure 23:
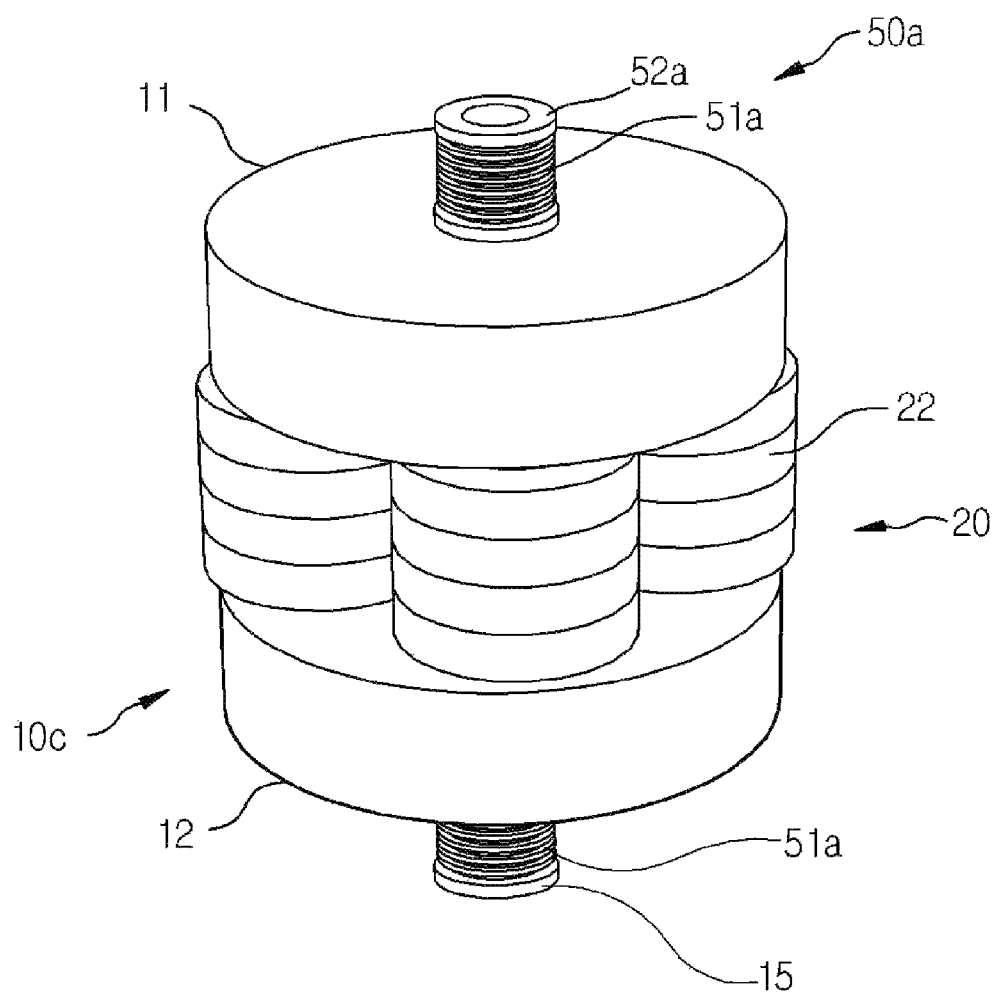
FIG. 23 is a perspective view illustrating a multi discharging tube plasma reactor according to a ninth embodiment of the present invention.
Figure 24:
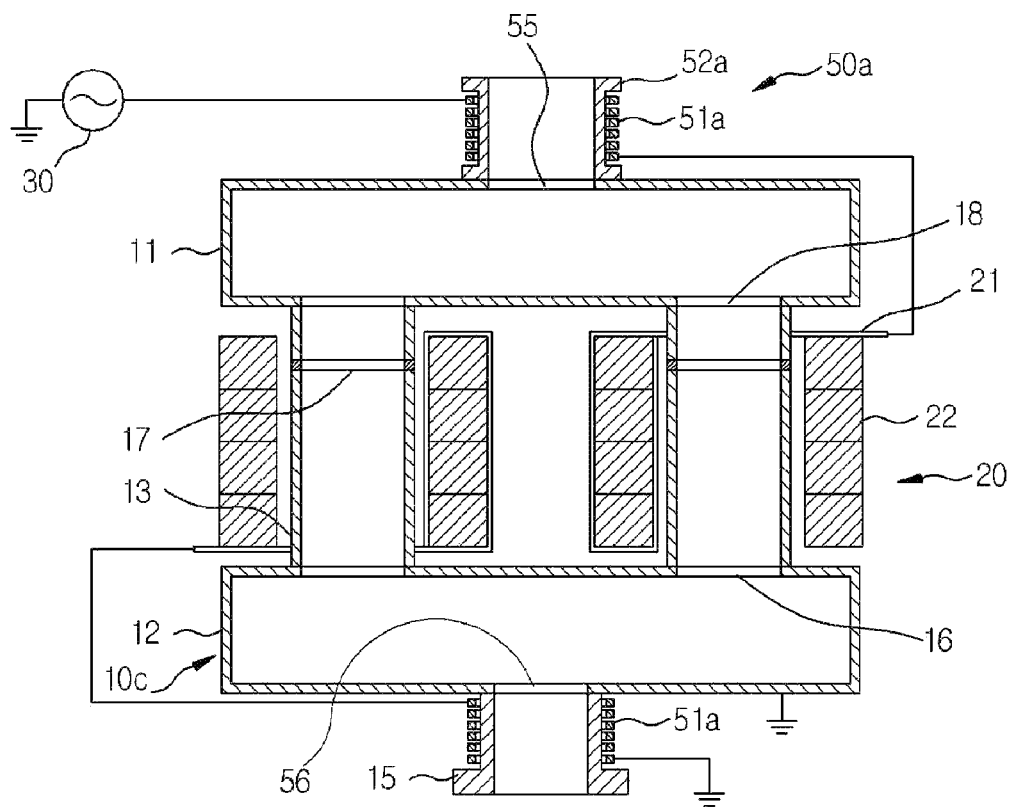
FIG. 24 is a cross-sectional view illustrating the multi discharging tube plasma reactor as shown in FIG. 23.

In a multi discharging tube plasma reactor 10a according to a ninth embodiment of the present invention, as shown in FIGS. 23 and 24, the inductively coupled plasma sources 50a are provided to the upper discharging tube 11 and the gas exit 15 at a lower part of the lower discharging tube 12, respectively, to be co-used as a gas inlet.

At this time, an upper discharging tube opening 55 is provided at an upper part of the upper discharging tube 11 and further a lower discharging tube opening 56 is provided at a lower part of the lower discharging tube 12.

Furthermore, the dielectric tube 52a is arranged to be protruded upwardly to the upper discharging tube opening 55 to be co-used as the gas inlet, and the inductive antenna winding coil 51a is arranged to the dielectric tube 52a. Accordingly, the gas in-flowed into the upper discharging tube 11 through the dielectric tube 52a is plasma-discharged at the moment while passing through the dielectric tube 52a.

Further, the gas passing through a plurality of discharging tube bridges 13 is plasma-discharged again while passing through the gas exit 15 on which the antenna winding coil 51a is arranged before the gas is injected into the process chamber 40.

Furthermore, a power may be applied alternatively to the inductive antenna winding coil 51a of the conductively coupled plasma source 50a to operate it.

Figure 25:
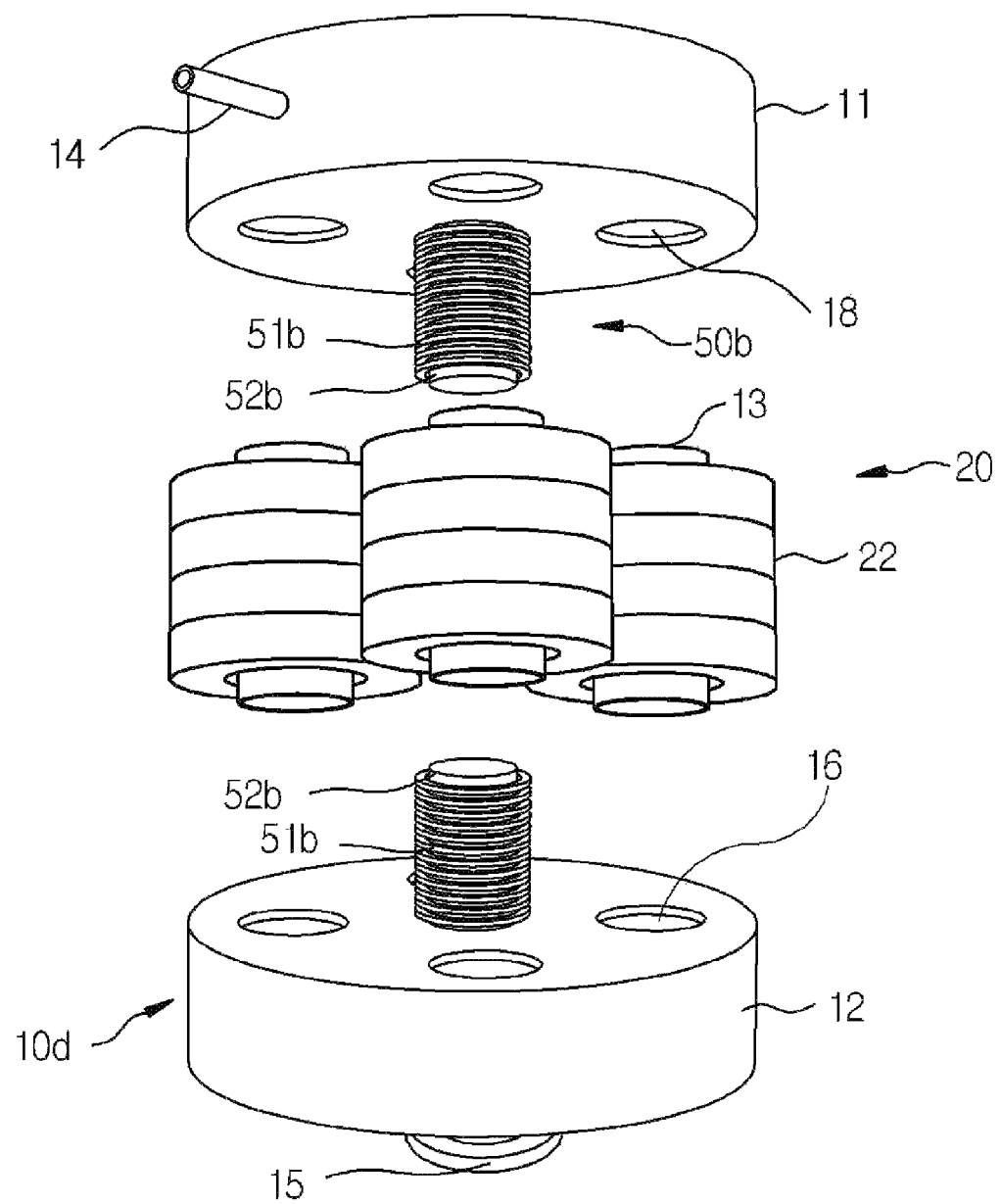
FIG. 25 is a perspective view illustrating a multi discharging tube plasma reactor according to a tenth embodiment of the present invention.
Figure 26:
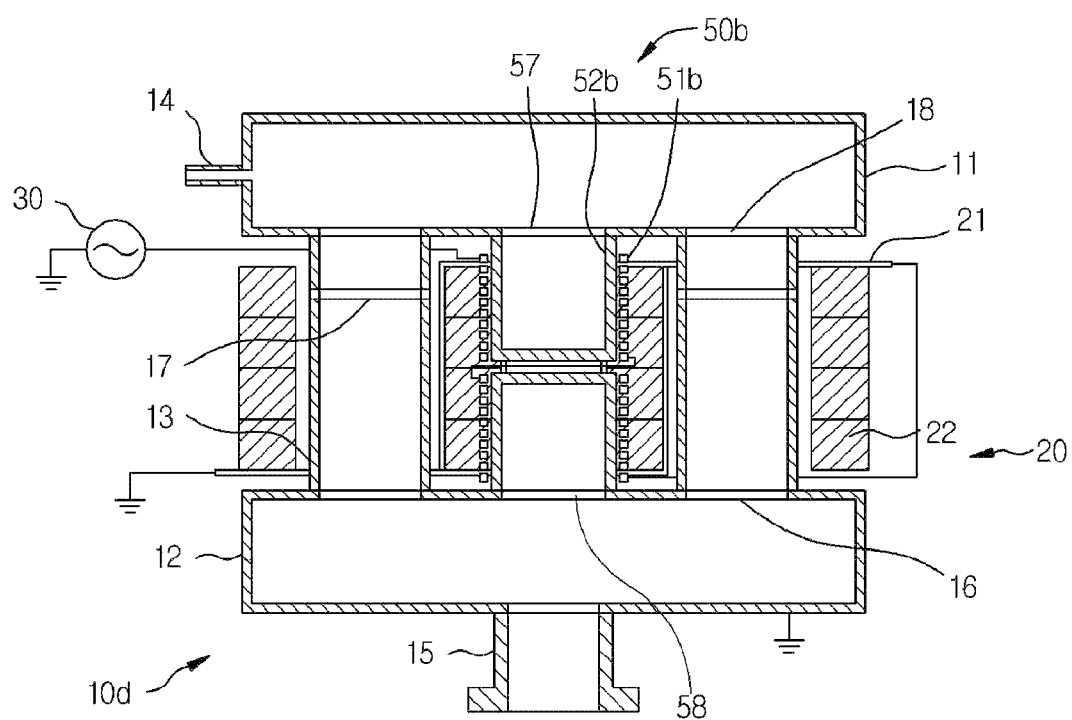
FIG. 26 is a cross-sectional view illustrating the multi discharging tube plasma reactor as shown in FIG. 25.

Meanwhile, in a multi discharging tube plasma reactor 10d according to a tenth embodiment of the present invention, as shown in FIGS. 25 and 26, the dielectric tube 52b is not co-used as the gas inlet. The upper discharging tube opening 54 is provided at a bottom of the upper discharging tube 11 and the lower discharging tube opening 55 is provided at an upper part of the lower discharging tube 12 wherein the dielectric tubes 52b protruding downwardly from the upper discharging tube opening 54 and upwardly from the lower discharging tube opening 55 are provided and the inductive antenna winding coil 51b is arranged on an outer peripheral surface of the dielectric tube 52b.

Since the plasma is maintained continuously and partially inside the upper discharging tube 11 and the lower discharging tube 12 by the inductively coupled plasma source 50b, the plasma discharging maintaining efficiency can be improved.

Figure 27:
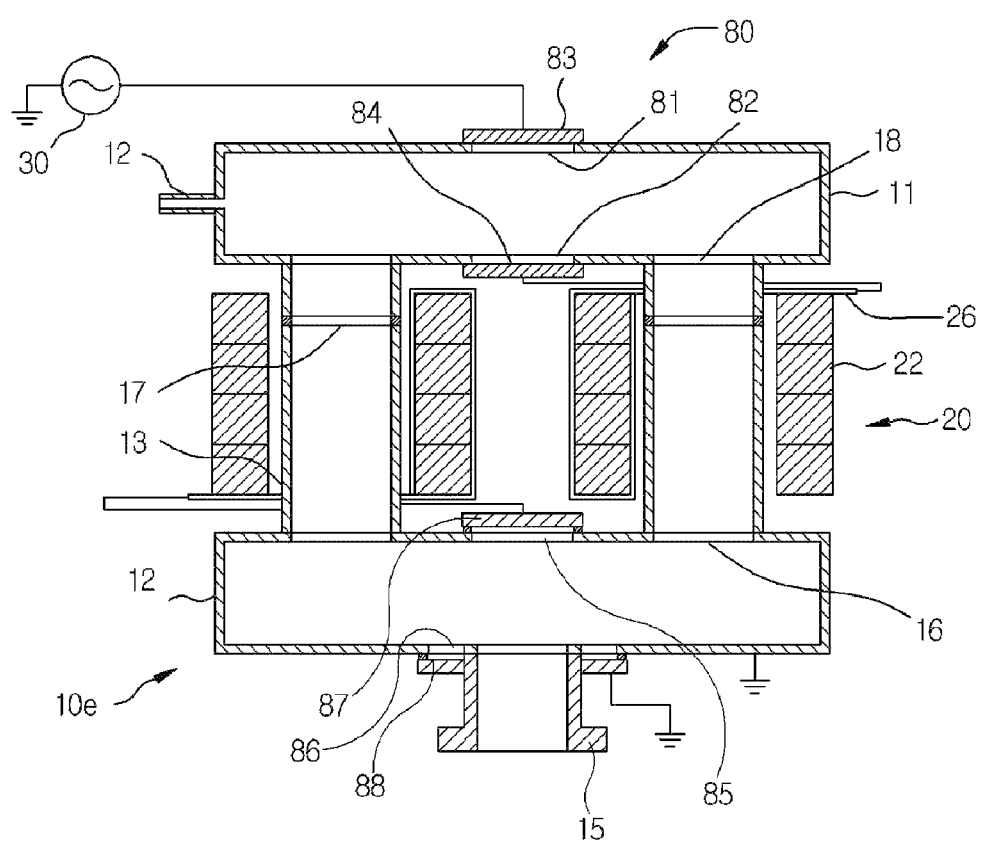
FIG. 27 is a perspective view illustrating a multi discharging tube plasma reactor according to an eleventh embodiment of the present invention.

Furthermore, a multi discharging tube plasma reactor 10e according to a eleventh embodiment of the present invention has basically the same configuration as the plasma reactor 10e in the fifth embodiment; however, in the plasma reactor 10e of the eleventh embodiment, as shown in FIG. 27, a first and second openings 81, 82 are provided on an upper part and a lower part of the upper discharging tube 11, respectively, and the capacitively coupled plasma source 80 is provided with the upper capacitively coupled electrodes 83, 84 arranged to the openings.

Furthermore, a third and fourth openings 85, 86 are provided at an upper part and a lower part of the lower discharging tube 12 and the lower capacitively coupled electrodes 87, 88 are arranged to the openings, respectively.

At this time, the upper capacitively coupled electrodes 83, 84 may be separated from the first and second openings 81, 82 of the upper discharging tube 11 by an insulator (not indicated with reference numerals in drawings) and the lower capacitively coupled electrodes 87, 88 may be separated from the third and fourth openings 85, 86 of the lower discharging tube 12 by an insulator (not indicated with reference numerals in drawings).

The upper and lower capacitively coupled electrodes 83, 84, 87, 88 of the capacitively coupled plasma source 80 and the first winding coil 26 of the transformer coupled plasma source 20 are connected to the power supply 30 in series. However, the upper and lower capacitively coupled electrodes 83, 84, 87, 88 and the first winding coil 26 may be connected to the power supply in parallel. Additionally, a switching circuit (not shown) may be provided for connecting them to the power supply in series or parallel, or connecting one of two to the power supply.

When the capacitively coupled plasma source 80 is added as described-above, a wide operational region of the reactor from a low voltage region to a high voltage region can be obtained stably. A plasma ignition can be generated easily and kept at the low voltage region by the capacitively coupled plasma source 80 and further plasma of a large capacity can be kept at the high voltage region without damage to the inside of the reactor by the transformer coupled plasma source 20. Two plasma sources can be operated efficiently with one power supply and further in a combined configuration of the capacitively coupled plasma source 80 and the transformer coupled plasma source 20, only one source may be driven alternatively or the combined source may be driven.

As described-above, the transformer coupled plasma source 20, the inductively coupled plasma sources 50, 50*a*, 50*b* and the capacitively coupled plasma source 80 are arranged integrally and the plasma of the transformer coupled plasma source can be maintained continuously while a low power is supplied to operate the inductively coupled plasma sources 50, 50*a*, 50*b* or the capacitively coupled plasma source 80.

According to a plasma reactor having multi discharging tubes of the present invention, the plasma of a large capacity can be generated stably in a wide pressure range from a low pressure to a high pressure (from 1 torr or less to 10 torr or more) by providing the multi discharging tubes.

Furthermore, according to a plasma reactor having multi discharging tubes of the present invention, a partition is provided between the upper discharging tube and the lower discharging tube to form two or more independent discharging regions in which different gases are activated at the respective independent discharging regions to be supplied separately into the process chamber and thus a problem that process efficiency is decreased when the different gases are mixed to be ionized can be prevented.

Further, according to the present invention, the plasma reactor can be operated in a wide operation range from a low pressure region to a high pressure region by installing integrally the inductively coupled plasma source or the capacitively coupled plasma source, in addition to the transformer coupled plasma source.

According to the plasma reactor of the present invention, two plasmas sources can be operated by using one power supply and in a combined configuration of the transformer coupled plasma source and other plasma sources, only one plasma source can be driven or the combined plasma source can be driven.

Furthermore, another object of the present invention is to provide a plasma reactor, capable of injecting different process gases into the multi discharging tubes to perform processes including a cleaning process for semiconductor.

Another object of the present invention is to provide a plasma reactor having multi discharging tubes, capable of maintaining a plasma state even at a low power.

While the plasma reactor having a multi discharging tube according to the present invention has been illustrated and described with reference to specific embodiments, it is apparent to those skilled in the art to which the present invention pertains that the present invention may be variously improved and changed without departing from the scope of the present invention.

What is claimed is:

1. A plasma reactor having multi discharging tubes, comprising:
    an upper hollow discharging tube having a gas inlet;
    a lower hollow discharging tube having a gas exit;
    a plurality of discharging tube bridges wherein an upper part and a lower part of each discharging tube bridge are coupled between the upper discharging tube and the lower discharging tube respectively;
    a transformer coupled plasma source that is equipped on the discharging tube bridge and has a magnetic core on which a first winding coil is wound; and
    a AC switching power supply for supplying plasma generation power to the first winding coil.

2. The plasma reactor having multi discharging tubes of claim 1, further comprising an inductively coupled plasma source having a dielectric flat window that is equipped to an upper opening formed at a part of the upper discharging tube and an inductive antenna flat coil that is arranged adjacently to the dielectric flat window wherein the inductive antenna flat coil and the first winding coil are coupled to the AC switching power supply in parallel or in series.

3. The plasma reactor having multi discharging tubes of claim 1, further comprising an inductively coupled plasma source having a dielectric tube that is arranged to be protruded upwardly to an upper discharging tube opening formed at a part of the upper discharging tube and an inductive antenna that is wound on the dielectric tube wherein the inductive antenna and the first winding coil are coupled to the AC switching power supply in parallel or in series.

4. The plasma reactor having multi discharging tubes of claim 1, further comprising a capacitively coupled plasma source provided with capacitively coupled electrodes to be equipped to at least two upper discharging tube openings formed at a part of the upper discharging tube wherein the capacitively coupled electrodes and the first winding coil are coupled to the AC switching power supply in parallel or in series.

5. The plasma reactor having multi discharging tubes of claim 1, wherein at least two gas exits of the lower discharging tube are provided wherein the gas in-flowed through the gas inlet and the discharging channel via the upper discharging tube, the lower discharging tube and the plurality of discharging tube bridges is activated by a plasma-discharging, distributed and supplied by the gas exits to at least two process chambers.

6. The plasma reactor having multi discharging tubes of claim 1, further comprising an inductively coupled plasma source provided with a dielectric flat window that is equipped at an lower opening formed at a part of the lower discharging tube and an inductive antenna flat coil that is arranged adjacently to the dielectric flat window wherein the inductive antenna flat coil and the first winding coil are coupled to the AC switching power supply in parallel or in series.

7. The plasma reactor having multi discharging tubes of claim 1, further comprising an inductively coupled plasma source provided with the lower discharging tube opening that is formed at a lower part of the lower discharging tube, a dielectric tube that is equipped to be protruded downwardly to the lower discharging tube opening, and an inductive antenna winding coil to be wound on the dielectric tube wherein the inductive antenna winding coil and the first winding coil are coupled to the AC switching power supply in parallel or in series.

8. The plasma reactor having multi discharging tubes of claim 1, further comprising an inductively coupled plasma source provided with the upper discharging tube opening that is formed a lower part of the upper discharging tube, a dielectric tube that is equipped to be protruded downwardly to the upper discharging tube opening, and an inductive antenna to be wound on the dielectric tube wherein the inductive antenna and the first winding coil are coupled to the AC switching power supply in parallel or in series.

9. The plasma reactor having multi discharging tubes of claim 1, further comprising an inductively coupled plasma source provided with the lower discharging tube opening that is formed at an upper part of the lower discharging tube, a dielectric tube that is equipped to be protruded upwardly to the lower discharging tube opening, and an inductive antenna to be wound on the dielectric tube wherein the inductive antenna and the first winding coil are coupled to the AC switching power supply in parallel or in series.

10. The plasma reactor having multi discharging tubes of claim 1, further comprising a capacitively coupled plasma source provided with a first and second openings formed at an upper part and a lower part of the upper discharging tube, upper capacitively coupled electrodes which are arranged respectively to an upper part and a lower part of the first and second openings, a third and fourth openings formed respectively at an upper part and a lower part of the lower discharging tube, and lower capacitively coupled electrodes which are arranged respectively to an upper part and a lower part of the third and fourth openings, wherein the upper and lower capacitively coupled electrodes and the first winding coil are coupled to the AC switching power supply in parallel or in series.

11. The plasma reactor having multi discharging tubes of claim 1, comprising at least one electric insulative member provided between the upper multi discharging tubes and the upper discharging tube, or between the multi discharging tubes and the lower discharging tube.

12. The plasma reactor having multi discharging tubes of claim 1, wherein the upper discharging tube comprises a partition for dividing the inside thereof to have at least two independent discharging regions.

13. The plasma reactor having multi discharging tubes of claim 1, wherein the lower discharging tube comprises a partition for dividing the inside thereof to have at least two independent discharging regions.

14. The plasma reactor having multi discharging tubes of claim 5, wherein the gas exit of the lower discharging tube comprises: a plurality of adaptor coupled to two or more process chambers; and a gas valve that is provided to the adaptor and controls flow amount of the activated gas flowed into the process chamber.

15. The plasma reactor having multi discharging tubes of claim 5, wherein the process chamber comprises exhaust valves which are provided respectively to the exhaust tubes, and control exhaust flow amount.

16. The plasma reactor having multi discharging tubes of claim 12, comprising a plurality of gas inlets which are coupled separately to the two or more discharging regions of the upper discharging tube.

17. The plasma reactor having multi discharging tubes of claim 13, further comprising a plurality of gas exits which are coupled separately to two or more discharging regions of the lower discharging tube.

* * * * *